US011050428B2

(12) United States Patent
Huang et al.

(10) Patent No.: US 11,050,428 B2
(45) Date of Patent: *Jun. 29, 2021

(54) SYNCHRONOUS SAMPLING IN-PHASE AND QUADRATURE-PHASE (I/Q) DETECTION CIRCUIT

(71) Applicant: Samsung Electronics Co., Ltd., Gyeonggi-do (KR)

(72) Inventors: Zhiqiang Huang, San Jose, CA (US); Chih-Wei Yao, Sunnyvale, CA (US); Hiep Pham, San Jose, CA (US)

(73) Assignee: Samsung Electronics Co., Ltd

( * ) Notice: Subject to any disclaimer, the term of this patent is extended or adjusted under 35 U.S.C. 154(b) by 0 days.

This patent is subject to a terminal disclaimer.

(21) Appl. No.: 17/010,322

(22) Filed: Sep. 2, 2020

(65) Prior Publication Data

US 2020/0403621 A1 Dec. 24, 2020

Related U.S. Application Data

(63) Continuation of application No. 16/220,898, filed on Dec. 14, 2018, now Pat. No. 10,812,088.

(60) Provisional application No. 62/736,597, filed on Sep. 26, 2018.

(51) Int. Cl.
| H03L 7/087 | (2006.01) |
| H04L 27/227 | (2006.01) |
| H03L 7/08 | (2006.01) |
| H03L 7/10 | (2006.01) |

(52) U.S. Cl.
CPC ............ *H03L 7/087* (2013.01); *H03L 7/0802* (2013.01); *H03L 7/10* (2013.01); *H04L 27/2273* (2013.01)

(58) Field of Classification Search
CPC ......... H03L 7/087; H03L 7/0802; H03L 7/10; H04L 27/2273
USPC ......................................................... 375/375
See application file for complete search history.

(56) References Cited

U.S. PATENT DOCUMENTS

| 4,449,086 A * | 5/1984 | Hoffmann ................ G04C 3/14 |
| | | 318/696 |
| 5,272,729 A * | 12/1993 | Bechade .............. H03K 5/1504 |
| | | 327/141 |
| 6,097,768 A | 8/2000 | Janesch et al. |
| 6,435,037 B1 * | 8/2002 | Doten ..................... A61B 8/06 |
| | | 73/861.27 |
| 7,720,188 B2 | 5/2010 | Sanduleanu et al. |
| | (Continued) | |

*Primary Examiner* — Wednel Cadeau
(74) *Attorney, Agent, or Firm* — The Farrell Law Firm, P.C.

(57) ABSTRACT

A synchronized I/Q detection circuit is provided. A first subset of input signals and, subsequently, a second subset of input signals are provided by a first multiplexer and received by a first phase detector. Outputs of the first phase detector are receiving, by a first reset and sampling circuit. A second set of input signals are provided by a second multiplexer and received by a second phase detector, from a second multiplexer, while the first multiplexer receives the first and second subsets of input signals. The first subset of input signals has a same phase order as the second set of input signals, and the second subset of input signals has a different phase order than the second set of input signals. Outputs of the second phase detector are received by a second reset and sampling circuit. A comparator outputs a detected phase difference based on the outputs of the first and second reset and sampling circuits.

24 Claims, 11 Drawing Sheets

(56) References Cited

U.S. PATENT DOCUMENTS

| | | |
|---|---|---|
| 8,634,510 B2 | 1/2014 | Kong et al. |
| 8,666,010 B1 | 3/2014 | Novellini |
| 9,356,611 B1 * | 5/2016 | Shyu .................... H03L 7/0818 |
| 2006/0039516 A1 * | 2/2006 | Germann ................ H03L 7/101 |
| | | 375/376 |
| 2007/0071156 A1 * | 3/2007 | Gregorius ................ H03L 7/18 |
| | | 375/376 |
| 2009/0135885 A1 | 5/2009 | Lin |
| 2013/0015769 A1 * | 1/2013 | Jung ................ H05B 41/2828 |
| | | 315/127 |

* cited by examiner

SYNCHRONOUS SAMPLING IN-PHASE AND QUADRATURE-PHASE (I/Q) DETECTION CIRCUIT

PRIORITY

This application is a Continuation Application of U.S. application Ser. No. 16/220,898, filed in the U.S. Patent and Trademark Office on Dec. 14, 2018, which claims priority under 35 U.S.C. § 119(e) to a U.S. Provisional Patent Application filed on Sep. 26, 2018 in the United States Patent and Trademark Office and assigned Ser. No. 62/736,597, the entire contents of which are incorporated herein by reference.

FIELD

The present disclosure relates generally to an in-phase/quadrature (I/Q) phase detection circuit, and more particularly, to a synchronous sampling I/Q phase detection circuit.

BACKGROUND

A wireless transceiver and quarter-rate wireline transceiver requires I/Q signals with accurate 90 degree phase difference.

Conventional I/Q phase detection circuits rely on low bandwidth resistor-capacitor (RC) filters to extract direct current (DC) values from a phase-detector. This requirement slows down the detection time. In addition, conventional phased detection circuits have low accuracy.

SUMMARY

According to one embodiment, a synchronized I/Q detection circuit is provided. The synchronized I/Q detection circuit includes a first multiplexer configured to provide a first subset of input signals and, subsequently, a second subset of input signals to a first phase detector. The circuit also includes the first phase detector configured to receive, from the first multiplexer, the first subset of input signals and, subsequently, the second subset of input signals, and a first reset and sampling circuit configured to receive outputs of the first phase detector. The circuit also includes a second multiplexer configured to provide a second set of input signals to a second phase detector. The circuit also includes the second phase detector configured to receive the second set of input signals from the second multiplexer while the first multiplexer receives the first and second subsets of input signals. The first subset of input signals has a same phase order as the second set of input signals, and the second subset of input signals has a different phase order than the second set of input signals. The circuit further includes a second reset and sampling circuit configured to receive outputs of the second phase detector, and a comparator configured to output a detected phase difference based on the outputs of the first and second reset and sampling circuits.

According to one embodiment, a method of a synchronized I/Q detection circuit is provided. A first subset of input signals and, subsequently, a second subset of input signals are provided from a first multiplexer and received by a first phase detector. Outputs of the first phase detector are receiving, by a first reset and sampling circuit. A second set of input signals are provided by a second multiplexer and received by a second phase detector, while the first multiplexer receives the first and second subsets of input signals. The first subset of input signals has a same phase order as the second set of input signals, and the second subset of input signals has a different phase order than the second set of input signals. Outputs of the second phase detector are received by a second reset and sampling circuit. A comparator outputs a detected phase difference based on the outputs of the first and second reset and sampling circuits.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
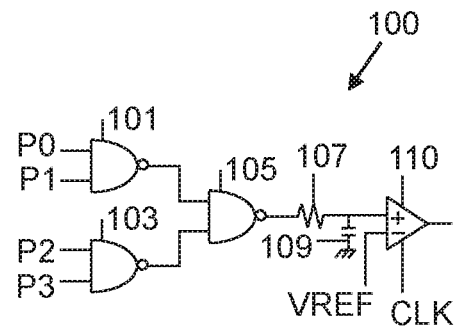
FIG. 1 is a diagram of a conventional I/Q phase detector.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

Embodiments of the present disclosure add reset and sampling circuits to outputs of two phase detectors. The reset and sampling signal timing with respect to the output of each phase detector is identical. As a result, incomplete settling is cancelled at an input of a comparator. This results in faster phase detector settling time comparisons as compared to conventional I/Q phase detection circuits.

Embodiments of the present disclosure improve the power efficiency in low bit-rate modes by turning on/off transmitters and receivers quickly to reduce power consumption. Thus, the complexity of package and routing between a modem and a radio frequency integrated circuit (RFIC) may be significantly reduced.

FIG. 1 is a diagram of a conventional I/Q phase detector 100.

Referring to FIG. 1, the I/Q phase detector 100 includes a first two-input NAND gate 101, a second two-input NAND gate 103, a third two-input NAND gate 105, a resistor 107, a capacitor 109, and a comparator 110.

The first two-input NAND gate 101 includes a first input for receiving a first input signal in a first phase P0, a second input for receiving a second input signal in a second phase P1, and an output.

The second two-input NAND gate 103 includes a first input for receiving a third input signal in a third phase P2, a second input for receiving a fourth input signal in a fourth phase P3, and an output.

The third two-input NAND gate 105 includes a first input connected to the output of the first NAND gate 101, a second input connected to the output of the second NAND gate 103, and an output.

The resistor 107 includes a first end connected to the output of the third NAND gate 105 and a second end.

The capacitor 109 includes a first end connected to the second end of the resistor 107 and a second end connected to a ground potential.

The comparator 110 includes a positive input connected to the second end of the resistor 107, a negative input for receiving a reference voltage VREF, a clock input for receiving a clock signal CLK, and an output.

The I/Q detection circuit 100 performs a logic operation (P0·P1+P2·P3) based on the four input signal phases of P0, P1, P2, and P3. The resistor-capacitor (RC) lowpass filter formed by the resistor 107 and the capacitor 109 extracts a DC value from a waveform generated at the output of the third NAND gate 105. If the DC value is too low, the P1/P3 pair has too much delay with respect to the P0/P2 pair timing. On the other hand, if the DC value is too high, the P1/P3 pair has too little delay with respect to the P0/P2 pair. The comparator 110 senses any difference between the voltage on the second end of the resistor 107 and VREF, where VREF is pre-determined. The comparator 110 performs comparisons at a rising edge of the clock signal CLK.

The convention I/Q detection circuit 100 has two issues. First, due to process variation, rising and falling times of logic gates may not be precisely controlled, the DC voltage at the output of the third NAND gate 105 for input signal waveforms P0, P1, P2, and P3 may vary with process. Thus, it is difficult to pre-determine a value for VREF that works well for all process corners. Even though a process-tracking VREF generation circuit may be developed, the process-tracking VREF generation circuit may not be precise enough to ensure accurate results across process corners and temperature variations. Second, if the bandwidth of the RC lowpass filter is not sufficiently low, the RC lowpass filter may not provide sufficient attenuation to high frequency signals. Thus, a voltage ripple would be present at the positive input of the comparator 110. The output of the comparator 110 would depend on the timing of the rising edge of CLK with respect to the voltage ripple. This dependency may be undesirable. A low bandwidth RC lowpass filter may be used to reduce the voltage ripple at the expense of increasing the settling time. A long settling time may be undesirable for some applications.

Figure 2:
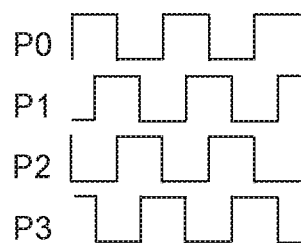
FIG. 2 is a chart of I/Q phase detector input signals in four phases.

FIG. 2 is a chart of I/Q phase detector input signals in four phases.

Referring to FIG. 2, the four input signal phases are P0, P1, P2 and P3. An example of a phase relationship between P0, P1, P2, and P3 is illustrated in FIG. 2. In FIG. 2, P0, P1, P2, and P3 each has a 50% duty cycle. In addition, P0 and P2 have a phase difference of 180 degrees. Similarly, P1 and P3 have a phase difference of 180 degrees. However, the present disclosure is not intended to be limited to the example illustrated in FIG. 2, and any other suitable phase relationship may be used.

Figure 3:
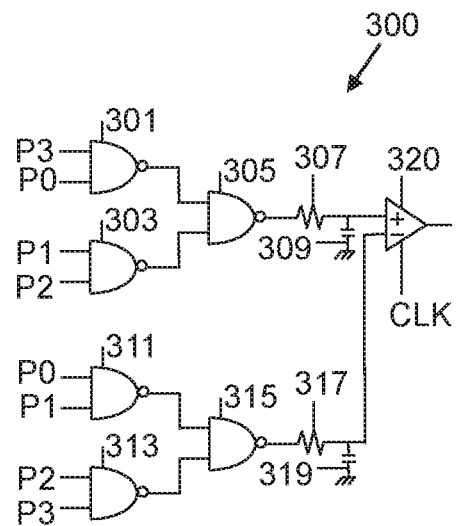
FIG. 3 is a diagram of a conventional I/Q phase detection circuit with process variation cancellation.

FIG. 3 is a diagram of a conventional I/Q phase detection circuit with process variation cancellation.

Referring to FIG. 3, the I/Q phase detection circuit 300 includes a first two-input NAND gate 301, a second two-input NAND gate 303, a third two-input NAND gate 305, a first resistor 307, a first capacitor 309, a fourth two-input NAND gate 311, a fifth two-input NAND gate 313, a sixth two-input NAND gate 315, a second resistor 317, a second capacitor 319, and a comparator 320. The first two-input NAND gate 301, the second two-input NAND gate 303, the third two-input NAND gate 305, the first resistor 307, and the first capacitor 309 form a first phase detector. The fourth two-input NAND gate 311, the fifth two-input NAND gate 313, the sixth two-input NAND gate 315, the second resistor 317, and the second capacitor 319 form a second phase detector.

The first two-input NAND gate 301 includes a first input for receiving a first input signal in the fourth phase P3, a second input for receiving a second input signal in the first phase P0, and an output.

The second two-input NAND gate 303 includes a first input for receiving a third input signal in the second phase P1, a second input for receiving a fourth input signal in the third phase P2, and an output.

The third two-input NAND gate 305 includes a first input connected to the output of the first NAND gate 301, a second input connected to the output of the second NAND gate 303, and an output.

The first resistor 307 includes a first end connected to the output of the third NAND gate 305 and a second end.

The first capacitor 309 includes a first end connected to the second end of the first resistor 307 and a second end connected to a ground potential.

The fourth two-input NAND gate 311 includes a first input for receiving the second input signal in the first phase P0, a second input for receiving the third input signal in the second phase P1, and an output.

The fifth two-input NAND gate 313 includes a first input for receiving the fourth input signal in the third phase P3, a second input for receiving the first input signal in the fourth phase P3, and an output.

The sixth two-input NAND gate 315 includes a first input connected to the output of the fourth NAND gate 311, a second input connected to the output of the fifth NAND gate 313, and an output.

The second resistor 317 includes a first end connected to the output of the sixth NAND gate 315 and a second end.

The second capacitor 319 includes a first end connected to the second end of the second resistor 317 and a second end connected to the ground potential.

The comparator 320 includes a positive input connected to the second end of the first resistor 307, a negative input connected to the second end of the second resistor 317, a clock input for receiving a clock signal CLK, and an output.

To resolve process dependency, two signals are generated by the first phase detector (i.e., the signal at the second end of the first resistor 307) and the second phase detector (i.e., the signal at the second end of the second resistor 317), respectively, using logic gates illustrated in FIG. 3. The first phase detector performs the logic function (P3·P0+P1·P2) and the second phase detector performs the logic function (P0·P1+P2·P3). The relative DC values from the first phase detector and the second phase detector indicates whether the P1/P3 pair should be shifted to be earlier or later as compared to the P0/P2 pair. If the first phase detector has a lower output DC value than the second phase detector, the P1/P3 pair is late with respect to the P0/P2 pair. If the first phase detector has a higher output DC value than the second phase detector, the P1/P3 pair is early with respect to the P0/P2 pair. Process-dependent rising and falling edge variations are cancelled out by the comparator 320. However, the voltage ripple issue described above still persists in the I/Q phase detection circuit 300, which limits the settling time.

Figure 4:
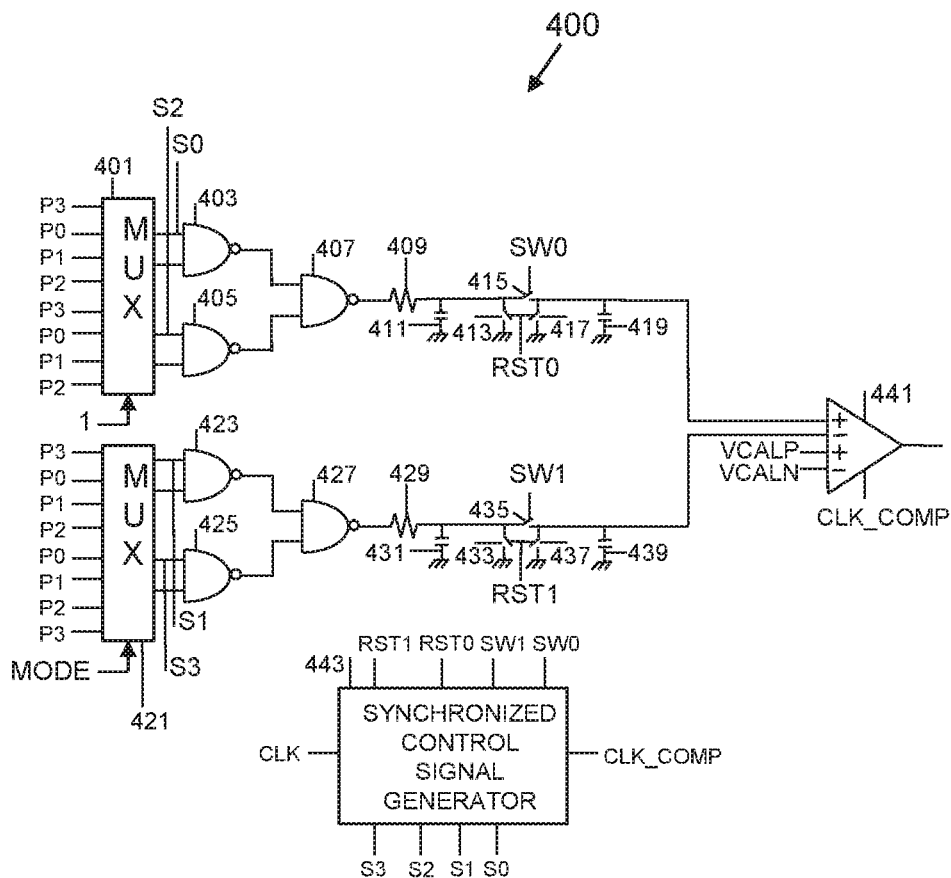
FIG. 4 is a diagram of a synchronous sampling I/Q phase detection circuit, according to one embodiment.

FIG. 4 is a diagram of a synchronous sampling I/Q phase detection circuit 400, according to one embodiment.

Referring to FIG. 4, the I/Q phase detection circuit 400 includes a first multiplexer 401, a first two-input NAND gate 403, a second two-input NAND gate 405, a third two-input NAND gate 407, a first resistor 409, a first capacitor 411, a first switch 413, a second switch 415, a third switch 417, a second capacitor 419, a second multiplexer 421, a fourth two-input NAND gate 423, a fifth two-input NAND gate 425, a sixth two-input NAND gate 427, a second resistor 429, a third capacitor 431, a fourth switch 433, a fifth switch 435, a sixth switch 437, a fourth capacitor 439, a comparator 441, and a synchronized control signal generator 443. The first multiplexer 401, the first two-input NAND gate 403, the second two-input NAND gate 405, the third two-input NAND gate 407, the first resistor 409, the first capacitor 411, the first switch 413, the second switch 415, the third switch 417, and the second capacitor 419 form a first phase detector. The second multiplexer 421, the fourth two-input NAND gate 423, the fifth two-input NAND gate 425, the sixth two-input NAND gate 427, the second resistor 429, the third capacitor 431, the fourth switch 433, the fifth switch 435, the sixth switch 437, and the fourth capacitor 439 form a second phase detector.

The first multiplexer 401 includes a first set of four inputs for receiving inputs signals in four phases (i.e., P0, P1, P2, and P3) in the phase order of P3, P0, P1, and P2, respectively, a second set of four inputs for receiving inputs signals in the same four phases in the same order as the first set of four inputs, a control signal for selecting either the first set of four inputs or the second set of four inputs, where the control signal may be set to a binary value "1" to always select the first set of input signals, and four outputs (i.e., a first output, a second output, a third output, and a fourth output), at which the selected set of four input signals (e.g., four inputs signals with phases in the order of P3, P0, P1, and P2) appears in the same order as they were input (i.e., P3, P0, P1, and P2), The first two-input NAND gate 403 includes a first input connected to the first output of the first multiplexer 401 for receiving the first input signal in the fourth phase P3, a second input connected to the second output of the first multiplexer 401 for receiving the second input signal in the first phase P0, and an output.

The second two-input NAND gate 405 includes a first input connected to the third output of the first multiplexer

401 for receiving the third input signal in the second phase P1, a second input connected to the fourth output of the first multiplexer 401 for receiving the fourth input signal in the third phase P2, and an output.

The third two-input NAND gate 407 includes a first input connected to the output of the first NAND gate 403, a second input connected to the output of the second NAND gate 405, and an output.

The first resistor 409 includes a first end connected to the output of the third NAND gate 407 and a second end.

The first capacitor 411 includes a first end connected to the second end of the first resistor 409 and a second end connected to a ground potential.

The first switch 413 includes a first end connected to the second end of the first resistor 409, a second end connected to the ground potential, and a control input for receiving a first reset signal RST0 for controlling whether the first switch 413 is open or closed.

The second switch 415 includes a first end connected to the second end of the first resistor 409, a second end connected to the first end of the second capacitor 419, and a control input for receiving a first sampling signal SW0 for controlling whether the second switch 415 is open or closed.

The third switch 417 includes a first end connected to the first end of the second capacitor 419, a second end connected to the ground potential, and a control input for receiving the first reset signal RST0 for controlling whether the third switch 417 is open or closed.

The second multiplexer 421 includes a first set of four inputs for receiving inputs signals in the four phases (i.e., P0, P1, P2, and P3) in a phase order of P3, P0, P1, and P2, respectively, which is the same as the first set of four inputs of the first multiplexer 401, a second set of four inputs for receiving inputs signals in the four phases in a different order (e.g., P0, P1, P2, and P3) than the first set of four inputs to the second multiplexer 421, a control signal MODE for selecting either the first set of four inputs or the second set of four inputs, where the control signal MODE may be set to a binary value "1" to select the first set of input signals (which would be the same signals output by the first multiplexer 401) or set to binary "0" to select the second set of four inputs (which would be different signals than those output by the first multiplexer 401), and four outputs (i.e., a first output, a second output, a third output, and a fourth output), at which the selected set of four input signals appears in the same order as they were input (e.g., the first set with phases in the order of P3, P0, P1, and P2 or the second set with phases in the order of P0, P1, P2, and P3). That is, when MODE is binary "1", the same signals are presented to the two phase detectors and the same values should be produced by the two phase detectors, except for any offset. When MODE is binary 1, the comparator 441 may be calibrated to cancel any offset between the first phase detector and the second phase detector. After offset cancellation, MODE is set to binary "0" so that input signals with a different ordering of phases (e.g., (P3, P0, P1, and P2) versus (P0, P1, P2, and P3)) are processed by the two phase detectors The fourth two-input NAND gate 423 includes a first input connected to the first output of the second multiplexer 421 for receiving the first input signal in either the fourth phase P3 when MODE is binary "1" or the first phase P0 when MODE is binary "0", a second input connected to the second output of the second multiplexer 421 for receiving the second input signal in the either first phase P0 when MODE is binary "1" or the second phase P1 when MODE is binary "0," and an output.

The fifth two-input NAND gate 425 includes a first input connected to the third output of the second multiplexer 421 for receiving the third input signal in either the second phase P1 when MODE is binary "1" or the third phase P2 when MODE is binary "0," a second input connected to the fourth output of the second multiplexer 421 for receiving the fourth input signal in either the third phase P2 when MODE is binary "1" or the fourth phase P3 when MODE is binary "0," and an output.

The I/Q phase detection circuit 400 generates four synchronization signals S0, S1, S2, and S3. The first synchronization signal S0 appears at the first input of the first NAND gate 403. The first synchronization signal S1 appears at the first input of the fourth NAND gate 423. The third synchronization signal S2 appears at the first input of the second NAND gate 405. The fourth synchronization signal S3 appears at the first input of the fifth NAND gate 425.

The sixth two-input NAND gate 427 includes a first input connected to the output of the fourth NAND gate 423, a second input connected to the output of the fifth NAND gate 425, and an output.

The second resistor 429 includes a first end connected to the output of the third NAND gate 427 and a second end.

The third capacitor 431 includes a first end connected to the second end of the second resistor 429 and a second end connected to a ground potential.

The fourth switch 433 includes a first end connected to the second end of the second resistor 429, a second end connected to the ground potential, and a control input for receiving a second reset signal RST1 for controlling whether the fourth switch 431 is open or closed.

The fifth switch 435 includes a first end connected to the second end of the second resistor 429, a second end connected to the first end of the fourth capacitor 439, and a control input for receiving a second sampling signal SW1 for controlling whether the fifth switch 435 is open or closed.

The sixth switch 437 includes a first end connected to the first end of the fourth capacitor 439, a second end connected to the ground potential, and a control input for receiving the second reset signal RST1 for controlling whether the sixth switch 437 is open or closed.

The comparator 441 includes a first positive input connected to the first end of the second capacitor 419, a first negative input connected to the first end of the fourth capacitor 439, a second positive input for receiving a positive calibration voltage VCALP for cancelling an offset between the first phase detector and the second phase detector when MODE is binary "1" (i.e., the same input signals with phases in the order of P3, P0, P1, and P2 are input to each of the first phase detector and the second phase detector), a second negative input for receiving a negative calibration voltage VCALN for cancelling an offset between the first phase detector and the second phase detector when MODE is binary "1," a clock compensation input for receiving a clock compensation signal CLK_COMP, and an output.

The synchronization control signal generator 443 includes a first input connected to the first input of the first NAND gate 403 for receiving the first synchronization signal S0, a second input connected to the first input of the fourth NAND gate 423 for receiving the second synchronization signal S1, a third input connected to the first input of the second NAND gate 405 for receiving the third synchronization signal S2, a fourth input connected to the first input of the fifth NAND gate 425 for receiving the fourth synchronization signal S3, a clock input for receiving a clock signal, a first output connected to the control inputs of the first switch 413 and the third switch 417 for providing the first reset signal RST0, a second output connected to the control inputs of the fourth switch 433 and the sixth switch 437 for providing the second reset signal RST1, a third output connected to the control input of the second switch 415 for providing the first sampling signal SW0, a fourth output connected to the control input of the fifth switch 435 for providing the second sampling signal SW1, and a fifth output for providing the clock compensation signal CLK_COMP.

To resolve the slow-settling problem of the conventional I/Q detection circuit 300 shown in FIG. 3, the synchronous sampling I/Q phase detection circuit 400 shown in FIG. 4 cancels incomplete settling at the first positive input and the first negative input of the comparator 441. At the second end of the first resistor 409 (i.e., the output of the RC lowpass filter of the first phase detector) and the second end of the second resistor 429 (i.e., the output of the RC lowpass filter of the second phase detector), a reset and sampling circuit is added (e.g., the first switch 413, the second switch 415, the third switch 417, and the second capacitor 419 for the first phase detector and the fourth switch 423, the fifth switch 435, the sixth switch 437, and the fourth capacitor 439 for the second phase detector). If the time for the first reset signal RST0 and the time for the first sampling signal SW0 with respect to the output of the first phase detector is the same as the time of the second reset signal RST1 and the time of the second sampling signal SW1 with respect to output of the second phase detector, respectively, the reset and sampling circuits for the first phase detector and the second phase detector have the same initial conditions and settling times. As a result, the same amount of incomplete of settling is present in both the first phase detector and the second phase detector. Thus, any offset due to settling is cancelled at the first positive input and the first negative input of the comparator 441.

The positive calibration voltage VCAP and the negative calibration voltage VCALN, which are used to cancel any offset between the first phase detector and the second phase detector as appears at the first positive input and the first negative input of the comparator 441, may be generated by a digital-to-analog converter (DAC). The four input signals (e.g., quadrature input signals), have phases P0 (e.g., 0 degrees), P1 (e.g., −90 degrees), P2 (e.g., −180 degrees), and P3 (e.g., −270 degrees), respectively.

The first multiplexer 401 and the second multiplexer 421 each has two sets of 4-inputs. When MODE is binary "1," the synchronous sampling I/Q phase detector is in offset calibration mode, and the first phase detector and the second phase each have the same inputs, and each performs the same logic function. Thus, the comparator 441 may be calibrated to cancel any offset due to sampler, logic, and comparator mismatch. The voltages VCALP and VCALN may be adjusted through a DAC until the comparator 441 output generates near equal probability of ones and zeros.

When MODE is binary "0," the synchronous sampling I/Q phase detection circuit 400 is in detection mode, here the first phase detector and the second phase detector have different inputs (e.g., the first phase detector has input signals with phases in the order of P3, P0, P1, and P2, and the second phase detector has inputs signals with phases in the order of P0, P1, P2, and P3). Thus, the first phase detector performs the same logic function as in offset calibration mode due to the inputs being the same, but the second phase detector performs a different logic function than in offset calibration mode because the second phase detector receives different input signals. Thus, in offset calibration mode, the first phase detector and the second phase detector each receive the same inputs and performs the same logic function. However, in detection mode, the first phase detector and the second phase detector receive different inputs and perform different logic functions due to the difference in input signals. By comparing the outputs of the first phase detector and the second phase detector in detection mode, a relative timing between the P0/P2 pair and the P1/P3 can be detected pair with process cancellation. This requires that each of the four input signal have a 50% duty cycle and precise 180 degree differences between the P0/P2 pair and between the P1/P3. When the input signal waveforms meet these requirements, correct functionality of the synchronous sampling I/Q phase detection circuit 400 is ensured. However, alternate embodiments that do not meet the above described requirements are possible.

At the output of each of the first RC lowpass filter (e.g., the first resistor 409 and the first capacitor 411) and the second RC lowpass filter (e.g., the second resistor 429 and the third capacitor 431), reset and sampling circuits (e.g., the first switch 413, the second switch 415, the third switch 417, and the second capacitor 419 for the first RC lowpass filer and the fourth switch 433, the fifth switch 435, the sixth switch 437, and the fourth capacitor 439 for the first RC lowpass filer) are added to allow synchronous settling time. The synchronized control signal generator 443 generates the control signals RST0, RST1, SW0, SW1 for the phase detectors. These control signals are synchronized with signals S0, S1, S2, and S3. SW0 and SW1 are re-timed version of CLK. RST0 and RST1 may have a 1.5 $T_{LO}$ pulse width right before SW0 and SW1. After the falling edge of SW0, the comparator 441 starts to compare the input signals on the first positive input and the first negative input of the comparator 441. The comparator 441 receives VCALP and VCALN on the second positive input and the second negative input of the comparator 441, respectively, to compensate for any offset between the first phase detector and the second phase detector.

Before comparing the outputs of the first phase detector and the second phase detector, the RC lowpass filters are each reset to ground by signals RST0 and RST1, respectively. The two reset signals RST0 and RST1 are de-asserted near the rising edge of outputs of the first phase detector and the second phase detector, respectively. When the reset signals RST0 and RST1 go low, the sampling switches for the first phase detector and the second phase detector are turn on (e.g., closed) by signals SW0 and SW1, respectively. Because the two RC lowpass filters were caused to have the same initial conditions and switch turn-on time, the first phase detector and the second phase detector have the output even if the outputs of the RC lowpass filter have not completely settled. The sampling switches are opened when signals SW0 and SW1 go low. For each phase detector, the reset signal and the sampling signal are aligned to the pulses generated by the phase detector. Thus, the synchronous sampling I/Q phase detection circuit 400 operates with incomplete, but synchronous, settling, because each phase detector is impacted in the same way during settling, and the equal effects of settling maybe cancelled by the comparator 441.

Figure 5:
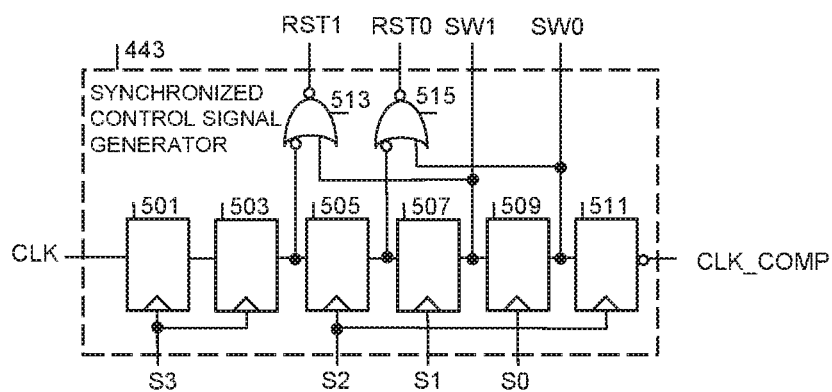
FIG. 5 is a block diagram of a synchronized control signal generator of the synchronous sampling I/Q phase detection circuit of FIG. 4, according to one embodiment.

FIG. 5 is a block diagram of the synchronized control signal generator 443 of the synchronous sampling I/Q phase detection circuit 400 of FIG. 4, according to one embodiment.

Referring to FIG. 5, the synchronized control signal generator 443 includes a first flip-flop 501, a second flip-flop 503, a third flip-flop 505, a fourth flip-flop 507, a fifth flip-flop 509, a sixth flip-flop 511, a first two-input NOR gate 513, and a second two-input NOR gate 515.

The first flip-flop 501 includes an input for receiving a signal CLK, a clock input for receiving signal S3, and a non-inverted output. The second flip-flop 503 includes an input connected to the non-inverted output of the first flip-flop 501, a clock input for receiving signal S3, and a non-inverted output. The third flip-flop 505 includes an input connected to the non-inverted output of the second flip-flop 503, a clock input for receiving signal S2, and a non-inverted output. The fourth flip-flop 507 includes an input connected to the non-inverted output of the third flip-flop 505, a clock input for receiving signal S1, and a non-inverted output for outputting SW1. The fifth flip-flop 509 includes an input connected to the non-inverted output of the fourth flip-flop 507, a clock input for receiving signal S0, and a non-inverted output for outputting SW0. The sixth flip-flop 511 includes an input connected to the non-inverted output of the fifth flip-flop 509, a clock input for receiving signal S2, and an inverted output for outputting CLK_COMP.

The first two-input NOR gate 513 includes a first inverted input connected to the non-inverted output of the second flip-flop 503, a second non-inverted input connected to the non-inverted output of the fourth flip-flop 507, and an output for outputting RST1.

The second two-input NOR gate 515 includes a first inverted input connected to the non-inverted output of the third flip-flop 505, a second non-inverted input connected to the non-inverted output of the fifth flip-flop 509, and an output for outputting RST0.

Voltage ripples are synchronized with using signals S0, S1, S2, and S3.

SW1 and SW0 each have the same turned-on time and are synchronized with voltage ripples.

Alternative logic functions may be used in the first phase detector and the second phase detector as described below.

FIGS. 6, 7, 8, and 9 illustrate four possible configurations, where each of the first phase detector and the second phase detector operates on two of the four available clock phases P0, P1, P2, and P3.

Figure 6:
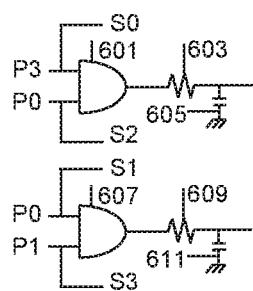
FIG. 6 is a diagram of a first phase detector and a second phase detector with alternative logic functions, according to one embodiment.

FIG. 6 is a diagram of a first phase detector and a second phase detector with alternative logic functions, according to one embodiment.

Referring to FIG. 6, the first phase detector includes a first two-input AND gate 601, a first resistor 603, and a first capacitor 605. The second phase detector includes a second two-input AND gate 607, a second resistor 609, and a second capacitor 611.

The first two-input AND gate 601 includes a first input for receiving a first input signal in a fourth phase P3, a second input for receiving a second input signal in a first phase P0, and an output. The first input of the first two-input AND gate 601 provides signal S0, and the second input of the first two-input AND gate 601 provides signal S2. Alternatively, an inverter may be connected to the first input of the first two-input AND gate 601, where an output of the inverter provides signal S2.

The first resistor 603 includes a first end connected to the output of the first two-input AND gate 601 and a second end.

The first capacitor 605 includes a first end connected to the second end of the first resistor 603 and a second end connected to a ground potential.

The second two-input AND gate 607 includes a first input for receiving a third input signal in a first phase P0, a second input for receiving a fourth input signal in a second phase P1, and an output. The first input of the second two-input AND gate 607 provides signal S1, and the second input of the second two-input AND gate 607 provides signal S3. Alternatively, an inverter may be connected to the first input of the second two-input AND gate 607, where an output of the inverter provides signal S3.

The second resistor 609 includes a first end connected to the output of the second two-input AND gate 607 and a second end.

The second capacitor 611 includes a first end connected to the second end of the second resistor 609 and a second end connected to a ground potential.

Figure 7:
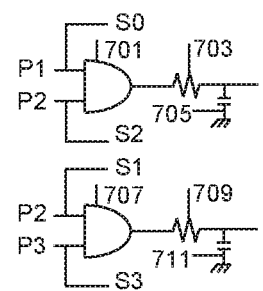
FIG. 7 is a diagram of a first phase detector and a second phase detector with alternative logic functions, according to one embodiment.

FIG. 7 is a diagram of a first phase detector and a second phase detector with alternative logic functions, according to one embodiment.

Referring to FIG. 7, the first phase detector includes a first two-input AND gate 701, a first resistor 703, and a first capacitor 705. The second phase detector includes a second two-input AND gate 707, a second resistor 709, and a second capacitor 711.

The first two-input AND gate 701 includes a first input for receiving a first input signal in a second phase P1, a second input for receiving a second input signal in a third phase P2, and an output. The first input of the first two-input AND gate 701 provides signal S0, and the second input of the first two-input AND gate 701 provides signal S2. Alternatively, an inverter may be connected to the first input of the first two-input AND gate 701, where an output of the inverter provides signal S2.

The first resistor 703 includes a first end connected to the output of the first two-input AND gate 701 and a second end.

The first capacitor 705 includes a first end connected to the second end of the first resistor 703 and a second end connected to a ground potential.

The second two-input AND gate 707 includes a first input for receiving a third input signal in a third phase P2, a second input for receiving a fourth input signal in a fourth phase P3, and an output. The first input of the second two-input AND gate 707 provides signal S1, and the second input of the second two-input AND gate 707 provides signal S3. Alternatively, an inverter may be connected to the first input of the second two-input AND gate 707, where an output of the inverter provides signal S3.

The second resistor 709 includes a first end connected to the output of the second two-input AND gate 707 and a second end.

The second capacitor 611 includes a first end connected to the second end of the second resistor 609 and a second end connected to a ground potential.

Figure 8:
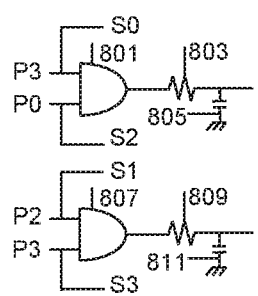
FIG. 8 is a diagram of a first phase detector and a second phase detector with alternative logic functions, according to one embodiment.

FIG. 8 is a diagram of a first phase detector and a second phase detector with alternative logic functions, according to one embodiment.

Referring to FIG. 8, the first phase detector includes a first two-input AND gate 801, a first resistor 803, and a first capacitor 805. The second phase detector includes a second two-input AND gate 807, a second resistor 809, and a second capacitor 811.

The first two-input AND gate 801 includes a first input for receiving a first input signal in a fourth phase P3, a second input for receiving a second input signal in a first phase P0, and an output. The first input of the first two-input AND gate 801 provides signal S0, and the second input of the first two-input AND gate 801 provides signal S2. Alternatively, an inverter may be connected to the first input of the first two-input AND gate 801, where an output of the inverter provides signal S2.

The first resistor 803 includes a first end connected to the output of the first two-input AND gate 801 and a second end.

The first capacitor 805 includes a first end connected to the second end of the first resistor 803 and a second end connected to a ground potential.

The second two-input AND gate 807 includes a first input for receiving a third input signal in a third phase P2, a second input for receiving a fourth input signal in a fourth phase P3, and an output. The first input of the second two-input AND gate 807 provides signal S1, and the second input of the second two-input AND gate 607 provides signal S3. Alternatively, an inverter may be connected to the first input of the second two-input AND gate 807, where an output of the inverter provides signal S3.

The second resistor 809 includes a first end connected to the output of the second two-input AND gate 807 and a second end.

The second capacitor 811 includes a first end connected to the second end of the second resistor 809 and a second end connected to a ground potential.

Figure 9:
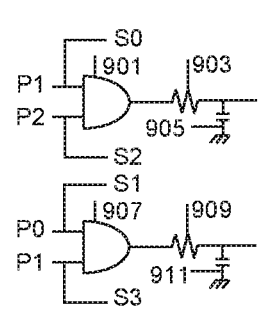
FIG. 9 is a diagram of a first phase detector and a second phase detector with alternative logic functions, according to one embodiment.

FIG. 9 is a diagram of a first phase detector and a second phase detector with alternative logic functions, according to one embodiment.

Referring to FIG. 9, the first phase detector includes a first two-input AND gate 901, a first resistor 903, and a first capacitor 905. The second phase detector includes a second two-input AND gate 907, a second resistor 909, and a second capacitor 911.

The first two-input AND gate 901 includes a first input for receiving a first input signal in a second phase P1, a second input for receiving a second input signal in a third phase P2, and an output. The first input of the first two-input AND gate 901 provides signal S0, and the second input of the first two-input AND gate 901 provides signal S2. Alternatively, an inverter may be connected to the first input of the first two-input AND gate 901, where an output of the inverter provides signal S2.

The first resistor 903 includes a first end connected to the output of the first two-input AND gate 901 and a second end.

The first capacitor 905 includes a first end connected to the second end of the first resistor 903 and a second end connected to a ground potential.

The second two-input AND gate 907 includes a first input for receiving a third input signal in a first phase P0, a second input for receiving a fourth input signal in a second phase P1, and an output. The first input of the second two-input AND gate 907 provides signal S1, and the second input of the second two-input AND gate 907 provides signal S3. Alternatively, an inverter may be connected to the first input of the second two-input AND gate 907, where an output of the inverter provides signal S3.

The second resistor 909 includes a first end connected to the output of the second two-input AND gate 907 and a second end.

The second capacitor 911 includes a first end connected to the second end of the second resistor 909 and a second end connected to a ground potential.

Figure 10:
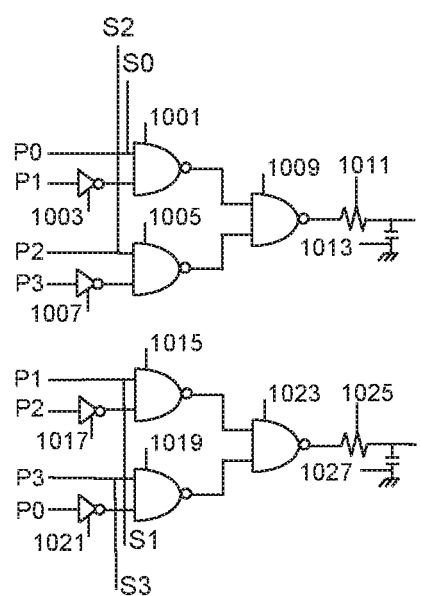
FIG. 10 is a diagram of a first phase detector and a second phase detector that use rising edges of input signals, according to one embodiment.

FIG. 10 is a diagram of a first phase detector and a second phase detector that use rising edges of input signals, according to one embodiment.

Referring to FIG. 10, the first phase detector includes a first two-input NAND gate 1001, a first inverter 1003, a second two-input NAND gate 1005, a second inverter 1007, a third two-input NAND gate 1009, a first resistor 1011, and a first capacitor 1013. The second phase detector includes a fourth two-input NAND gate 1015, a third inverter 1017, a fifth two-input NAND gate 1019, a fourth inverter 1021, a sixth two-input NAND gate 1023, a second resistor 1025, and a second capacitor 1027.

The first two-input NAND gate 1001 includes a first input for receiving a first input signal in the first phase P0, a second input connected to the output of the first inverter 1003, and an output. The first inverter 1003 includes an input for receiving a second input signal in the second phase P1.

The second two-input NAND gate 1005 includes a first input for receiving a third input signal in the third phase P2, a second input connected to the output of the second inverter 1007, and an output. The second inverter 1007 includes an input for receiving a fourth input signal in the fourth phase P3.

The first input of the first two-input NAND gate 1001 provides signal S0, and the first input of the second two-input NAND gate 1005 provides signal S2.

The third two-input NAND gate 1009 includes a first input connected to the output of the first NAND gate 1001, a second input connected to the output of the second NAND gate 1005, and an output.

The first resistor 1011 includes a first end connected to the output of the third NAND gate 1009 and a second end.

The first capacitor 1013 includes a first end connected to the second end of the first resistor 1011 and a second end connected to a ground potential.

The fourth two-input NAND gate 1015 includes a first input for receiving a fifth input signal in the second phase P1, a second input connected to the output of the third inverter 1017, and an output. The third inverter 1017 includes an input for receiving a sixth input signal in the third phase P2.

The fifth two-input NAND gate 1019 includes a first input for receiving a seventh input signal in the fourth phase P3, a second input connected to the output of the fourth inverter 1021, and an output. The fourth inverter 1021 includes an input for receiving an eighth input signal in the first phase P0.

The first input of the fourth two-input NAND gate 1015 provides signal S1, and the first input of the fifth two-input NAND gate 1019 provides signal S3.

The sixth two-input NAND gate 1023 includes a first input connected to the output of the fourth NAND gate 1015, a second input connected to the output of the fifth NAND gate 1019, and an output.

The second resistor 1025 includes a first end connected to the output of the sixth NAND gate 1023 and a second end.

The second capacitor 1027 includes a first end connected to the second end of the second resistor 1025 and a second end connected to a ground potential.

FIG. 10 illustrates a first phase detector and a second phase detector that each use only rising edges of the four input signals. The logic expression ignores the falling edges, and therefore, the first phase detector and the second phase detector can tolerate duty cycle variations. However, the first phase detector and the second phase detector still requires the timing from the rising edge of P0 to the rising edge of P2 to be a half clock cycle. Similarly, the first phase detector and the second phase detector require the timing from rising edges of P0 to the rising edges of P2 be a half clock cycle.

FIGS. 11, 12, 13, and 14 illustrate four possible configurations where each of a first phase detector and a second phase detector operates on two of the four available input signal phases, relies on only rising edges of an input signal, and does not require an input signal to have a 50% duty cycle.

Figure 11:
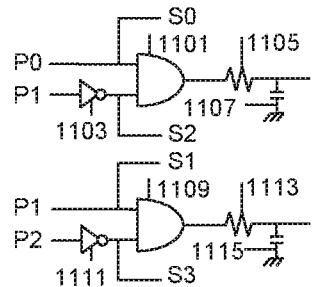
FIG. 11 is a diagram of a first phase detector and a second phase detector that use only two phases and rising edges of input signals, according to one embodiment.

FIG. 11 is a diagram of a first phase detector and a second phase detector that use only two phases and rising edges of input signals, according to one embodiment.

Referring to FIG. 11, the first phase detector includes a first two-input AND gate 1101, a first inverter 1103, a first resistor 1105, and a first capacitor 1107. The second phase detector includes a second two-input AND gate 1109, a second inverter 1111, a second resistor 1113, and a second capacitor 1115.

The first two-input AND gate 1101 includes a first input for receiving a first input signal in a first phase P0, a second input connected to an output of the first inverter 1103. The first inverter 1103 includes an input for receiving a second input signal in a second phase P1, and an output. The first input of the first two-input AND gate 1101 provides signal S0, and the second input of the first two-input AND gate 1101 provides signal S2. Alternatively, an inverter may be connected to the first input of the first two-input AND gate 1101, where an output of the inverter provides signal S2.

The first resistor 1105 includes a first end connected to the output of the first two-input AND gate 1101 and a second end.

The first capacitor 1107 includes a first end connected to the second end of the first resistor 1105 and a second end connected to a ground potential.

The second two-input AND gate 1109 includes a first input for receiving a third input signal in a second phase P1, a second input connected to an output of the second inverter 1111. The second inverter 1111 includes an input for receiving a fourth input signal in a third phase P2, and an output. The first input of the second two-input AND gate 1109 provides signal S1, and the second input of the second two-input AND gate 1109 provides signal S3. Alternatively, an inverter may be connected to the first input of the second two-input AND gate 1109, where an output of the inverter provides signal S3.

The second resistor 1113 includes a first end connected to the output of the second two-input AND gate 1109 and a second end.

The second capacitor 1115 includes a first end connected to the second end of the second resistor 1113 and a second end connected to a ground potential.

Figure 12:
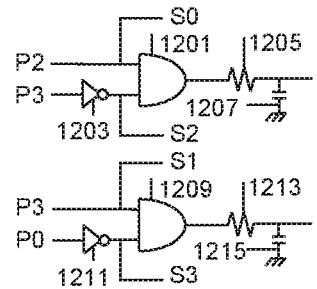
FIG. 12 is a diagram of a first phase detector and a second phase detector that use only two phases and rising edges of input signals, according to one embodiment.

FIG. 12 is a diagram of a first phase detector and a second phase detector that use only two phases and rising edges of input signals, according to one embodiment.

Referring to FIG. 12, the first phase detector includes a first two-input AND gate 1201, a first inverter 1203, a first resistor 1205, and a first capacitor 1207. The second phase detector includes a second two-input AND gate 1209, a second inverter 1211, a second resistor 1213, and a second capacitor 1215.

The first two-input AND gate 1201 includes a first input for receiving a first input signal in a third phase P2, a second input connected to an output of the first inverter 1203. The first inverter 1203 includes an input for receiving a second input signal in a fourth phase P3, and an output. The first input of the first two-input AND gate 1201 provides signal S0, and the second input of the first two-input AND gate 1201 provides signal S2. Alternatively, an inverter may be connected to the first input of the first two-input AND gate 1201, where an output of the inverter provides signal S2.

The first resistor 1205 includes a first end connected to the output of the first two-input AND gate 1201 and a second end.

The first capacitor 1207 includes a first end connected to the second end of the first resistor 1205 and a second end connected to a ground potential.

The second two-input AND gate 1209 includes a first input for receiving a third input signal in a fourth phase P3, a second input connected to an output of the second inverter 1211. The second inverter 1211 includes an input for receiving a fourth input signal in a first phase P0, and an output. The first input of the second two-input AND gate 1209 provides signal S1, and the second input of the second two-input AND gate 1209 provides signal S3. Alternatively, an inverter may be connected to the first input of the second two-input AND gate 1209, where an output of the inverter provides signal S3.

The second resistor 1213 includes a first end connected to the output of the second two-input AND gate 1209 and a second end.

The second capacitor 1215 includes a first end connected to the second end of the second resistor 1213 and a second end connected to a ground potential.

Figure 13:
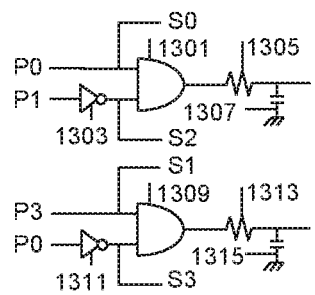
FIG. 13 is a diagram of a first phase detector and a second phase detector that use only two phases and rising edges of input signals, according to one embodiment.

FIG. 13 is a diagram of a first phase detector and a second phase detector that use only two phases and rising edges of input signals, according to one embodiment.

Referring to FIG. 13, the first phase detector includes a first two-input AND gate 1301, a first inverter 1303, a first resistor 1305, and a first capacitor 1307. The second phase detector includes a second two-input AND gate 1309, a second inverter 1311, a second resistor 1313, and a second capacitor 1315.

The first two-input AND gate 1301 includes a first input for receiving a first input signal in a first phase P0, a second input connected to an output of the first inverter 1303. The first inverter 1303 includes an input for receiving a second input signal in a second phase P1, and an output. The first input of the first two-input AND gate 1301 provides signal S0, and the second input of the first two-input AND gate 1301 provides signal S2. Alternatively, an inverter may be connected to the first input of the first two-input AND gate 1301, where an output of the inverter provides signal S2.

The first resistor 1305 includes a first end connected to the output of the first two-input AND gate 1301 and a second end.

The first capacitor 1307 includes a first end connected to the second end of the first resistor 1305 and a second end connected to a ground potential.

The second two-input AND gate 1309 includes a first input for receiving a third input signal in a fourth phase P3, a second input connected to an output of the second inverter 1311. The second inverter 1311 includes an input for receiving a fourth input signal in a first phase P0, and an output. The first input of the second two-input AND gate 1309 provides signal S1, and the second input of the second two-input AND gate 1309 provides signal S3. Alternatively, an inverter may be connected to the first input of the second two-input AND gate 1309, where an output of the inverter provides signal S3.

The second resistor 1313 includes a first end connected to the output of the second two-input AND gate 1309 and a second end.

The second capacitor 1315 includes a first end connected to the second end of the second resistor 1313 and a second end connected to a ground potential.

Figure 14:
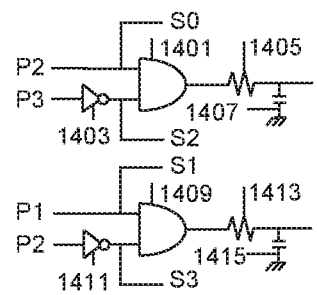
FIG. 14 is a diagram of a first phase detector and a second phase detector that use only two phases and rising edges of input signals, according to one embodiment.

FIG. 14 is a diagram of a first phase detector and a second phase detector that use only two phases and rising edges of input signals, according to one embodiment.

Referring to FIG. 14, the first phase detector includes a first two-input AND gate 1401, a first inverter 1403, a first resistor 1405, and a first capacitor 1407. The second phase detector includes a second two-input AND gate 1409, a second inverter 1411, a second resistor 1413, and a second capacitor 1415.

The first two-input AND gate 1401 includes a first input for receiving a first input signal in a third phase P2, a second input connected to an output of the first inverter 1403. The first inverter 1403 includes an input for receiving a second input signal in a fourth phase P3, and an output. The first input of the first two-input AND gate 1401 provides signal S0, and the second input of the first two-input AND gate 1401 provides signal S2. Alternatively, an inverter may be connected to the first input of the first two-input AND gate 1401, where an output of the inverter provides signal S2.

The first resistor 1405 includes a first end connected to the output of the first two-input AND gate 1401 and a second end.

The first capacitor 1407 includes a first end connected to the second end of the first resistor 1405 and a second end connected to a ground potential.

The second two-input AND gate 1409 includes a first input for receiving a third input signal in a second phase P1, a second input connected to an output of the second inverter 1411. The second inverter 1411 includes an input for receiving a fourth input signal in a third phase P2, and an output. The first input of the second two-input AND gate 1409 provides signal S1, and the second input of the second two-input AND gate 1409 provides signal S3. Alternatively, an inverter may be connected to the first input of the second two-input AND gate 1409, where an output of the inverter provides signal S3.

The second resistor 1413 includes a first end connected to the output of the second two-input AND gate 1409 and a second end.

The second capacitor 1415 includes a first end connected to the second end of the second resistor 1413 and a second end connected to a ground potential.

Figure 15:
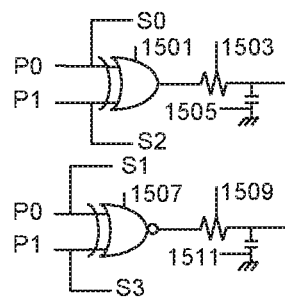
FIG. 15 is a diagram of a first XOR phase detector and a second XNOR phase detector that require only two 50% duty cycle input signal phases, according to one embodiment.

FIG. 15 is a diagram of a first XOR phase detector and a second XNOR phase detector that require only two 50% duty cycle input signal phases, according to one embodiment.

Referring to FIG. 15, the first phase detector includes a two-input XOR gate 1501, a first resistor 1503, and a first capacitor 1505. The second phase detector includes a two-input XNOR gate 1507, a second resistor 1509, and a second capacitor 1511.

The two-input XOR gate 1501 includes a first input for receiving a first input signal in a first phase P0, a second input for receiving a second input signal in a second phase P1, and an output. The first input of the two-input XOR gate 1501 provides signal S0, and the second input of the two-input XOR gate 1501 provides signal S2. Alternatively, an inverter may be connected to the first input of the two-input XOR gate 1501, where an output of the inverter provides signal S2.

The first resistor 1503 includes a first end connected to the output of the two-input XOR gate 1501 and a second end.

The first capacitor 1505 includes a first end connected to the second end of the first resistor 1503 and a second end connected to a ground potential.

The two-input XNOR gate 1507 includes a first input for receiving a third input signal in a first phase P0, a second input for receiving a fourth input signal in a second phase P1, and an output. The first input of the two-input XNOR gate 1507 provides signal S1, and the second input of the two-input XNOR gate 1507 provides signal S3. Alternatively, an inverter may be connected to the first input of the two-input XNOR gate 1507, where an output of the inverter provides signal S3.

The second resistor 1509 includes a first end connected to the output of the two-input XNOR gate 1507 and a second end.

The second capacitor 1511 includes a first end connected to the second end of the second resistor 1509 and a second end connected to a ground potential.

The first phase detector and the second phase detector of FIG. 15 only require two 50% duty cycle input signal phases. The two-input XOR gate 1501 and the two-input XNOR gate 1507 should be designed to extract precise timing information from the two input signals.

Figure 16:
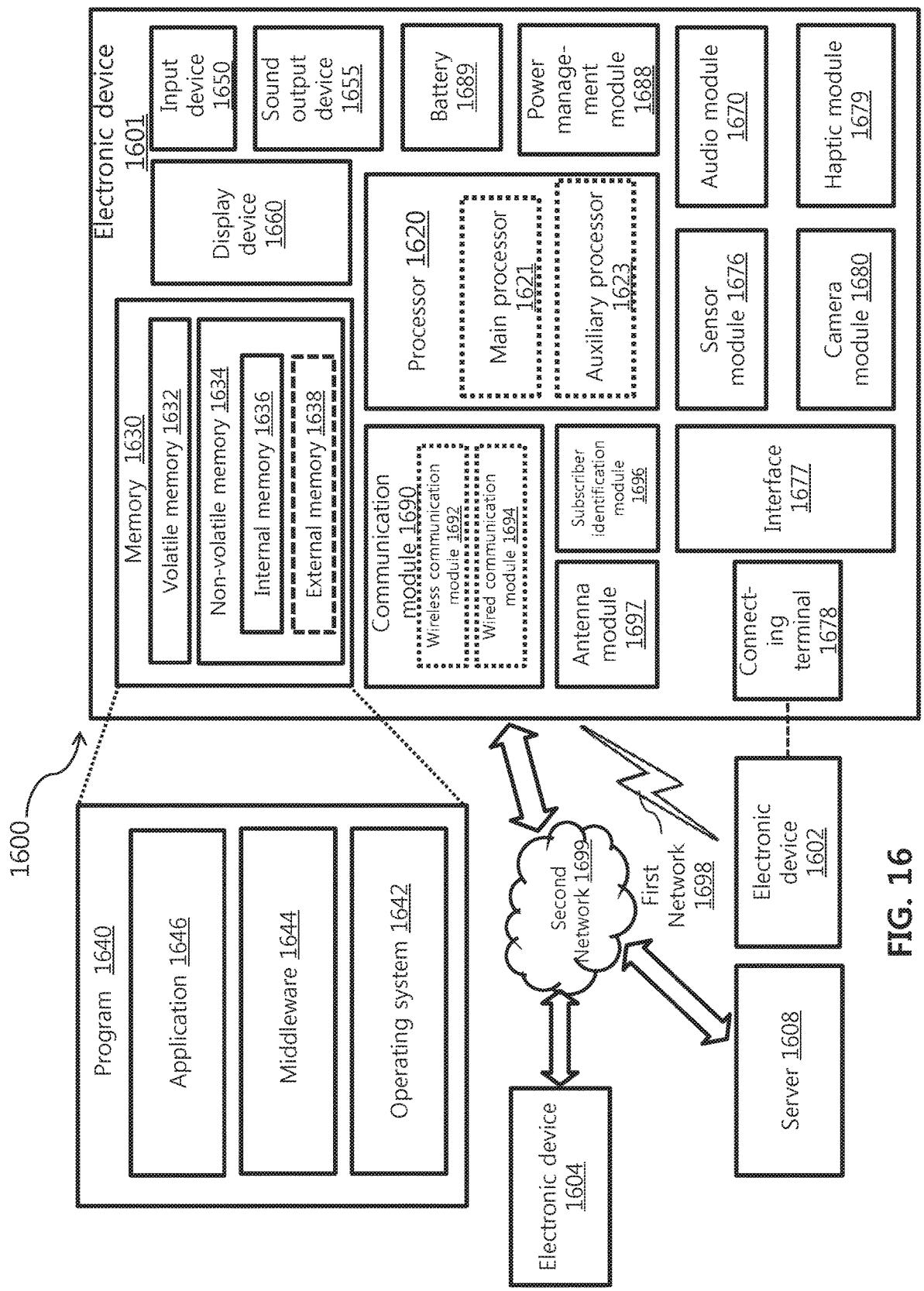
FIG. 16 is a block diagram of an electronic device in a network environment, according to one embodiment.

FIG. 16 is a block diagram illustrating an electronic device 1601 in a network environment 1600 according to various embodiments.

Referring to FIG. 16, the electronic device 1601 in the network environment 1600 may communicate with an electronic device 1602 via a first network 1698 (e.g., a short-range wireless communication network), or an electronic device 1604 or a server 1608 via a second network 1699 (e.g., a long-range wireless communication network). According to an embodiment, the electronic device 1601 may communicate with the electronic device 1604 via the server 1608. According to an embodiment, the electronic device 1601 may include a processor 1620, memory 1630, an input device 1650, a sound output device 1655, a display device 1660, an audio module 1670, a sensor module 1676, an interface 1677, a haptic module 1679, a camera module 1680, a power management module 1688, a battery 1689, a communication module 1690, a subscriber identification module (SIM) 1696, or an antenna module 1697. In some embodiments, at least one (e.g., the display device 1660 or the camera module 1680) of the components may be omitted from the electronic device 1601, or one or more other components may be added in the electronic device 1601. In some embodiments, some of the components may be implemented as single integrated circuitry. For example, the sensor module 1676 (e.g., a fingerprint sensor, an iris sensor, or an illuminance sensor) may be implemented as embedded in the display device 1660 (e.g., a display).

The processor 1620 may execute, for example, software (e.g., a program 1640) to control at least one other component (e.g., a hardware or software component) of the electronic device 1601 coupled with the processor 1620, and may perform various data processing or computation. According to one embodiment, as at least part of the data processing or computation, the processor 1620 may load a command or data received from another component (e.g., the sensor module 1676 or the communication module 1690) in volatile memory 1632, process the command or the data stored in the volatile memory 1632, and store resulting data in non-volatile memory 1634. According to an embodiment, the processor 1620 may include a main processor 1621 (e.g., a central processing unit (CPU) or an application processor (AP)), and an auxiliary processor 1623 (e.g., a graphics processing unit (GPU), an image signal processor (ISP), a sensor hub processor, or a communication processor (CP)) that is operable independently from, or in conjunction with, the main processor 1621. Additionally or alternatively, the auxiliary processor 1623 may be adapted to consume less power than the main processor 1621, or to be specific to a specified function. The auxiliary processor 1623 may be implemented as separate from, or as part of the main processor 1621.

The auxiliary processor 1623 may control at least some of functions or states related to at least one component (e.g., the display device 1660, the sensor module 1676, or the communication module 1690) among the components of the electronic device 1601, instead of the main processor 1621 while the main processor 1621 is in an inactive (e.g., sleep) state, or together with the main processor 1621 while the main processor 1621 is in an active state (e.g., executing an application). According to an embodiment, the auxiliary processor 1623 (e.g., an image signal processor or a communication processor) may be implemented as part of another component (e.g., the camera module 1680 or the communication module 1690) functionally related to the auxiliary processor 1623.

The memory 1630 may store various data used by at least one component (e.g., the processor 1620 or the sensor module 1676) of the electronic device 1601. The various data may include, for example, software (e.g., the program 1640) and input data or output data for a command related thereto. The memory 1630 may include the volatile memory 1632 or the non-volatile memory 1634.

The program 1640 may be stored in the memory 1630 as software, and may include, for example, an operating system (OS) 1642, middleware 1644, or an application 1646.

The input device 1650 may receive a command or data to be used by other component (e.g., the processor 1620) of the electronic device 1601, from the outside (e.g., a user) of the electronic device 1601. The input device 1650 may include, for example, a microphone, a mouse, a keyboard, or a digital pen (e.g., a stylus pen).

The sound output device 1655 may output sound signals to the outside of the electronic device 1601. The sound output device 1655 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1660 may visually provide information to the outside (e.g., a user) of the electronic device 1601. The display device 1660 may include, for example, a display, a hologram device, or a projector and control circuitry to control a corresponding one of the display, hologram device, and projector. According to an embodiment, the display device 1660 may include touch circuitry adapted to detect a touch, or sensor circuitry (e.g., a pressure sensor) adapted to measure the intensity of force incurred by the touch.

The audio module 1670 may convert a sound into an electrical signal and vice versa. According to an embodiment, the audio module 1670 may obtain the sound via the input device 1650, or output the sound via the sound output device 1655 or a headphone of an external electronic device (e.g., an electronic device 1602) directly (e.g., wiredly) or wirelessly coupled with the electronic device 1601.

The sensor module 1676 may detect an operational state (e.g., power or temperature) of the electronic device 1601 or an environmental state (e.g., a state of a user) external to the electronic device 1601, and then generate an electrical signal or data value corresponding to the detected state. According to an embodiment, the sensor module 1676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1677 may support one or more specified protocols to be used for the electronic device 1601 to be coupled with the external electronic device (e.g., the electronic device 1602) directly (e.g., wiredly) or wirelessly. According to an embodiment, the interface 1677 may include, for example, a high definition multimedia interface (HDMI), a universal serial bus (USB) interface, a secure digital (SD) card interface, or an audio interface.

A connecting terminal 1678 may include a connector via which the electronic device 1601 may be physically connected with the external electronic device (e.g., the electronic device 1602). According to an embodiment, the connecting terminal 1678 may include, for example, a HDMI connector, a USB connector, a SD card connector, or an audio connector (e.g., a headphone connector).

The haptic module 1679 may convert an electrical signal into a mechanical stimulus (e.g., a vibration or a movement) or electrical stimulus which may be recognized by a user via his tactile sensation or kinesthetic sensation. According to an embodiment, the haptic module 1679 may include, for example, a motor, a piezoelectric element, or an electric stimulator.

The camera module 1680 may capture a still image or moving images. According to an embodiment, the camera module 1680 may include one or more lenses, image sensors, image signal processors, or flashes.

The power management module 1688 may manage power supplied to the electronic device 1601. According to one embodiment, the power management module 1688 may be implemented as at least part of, for example, a power management integrated circuit (PMIC).

The battery 1689 may supply power to at least one component of the electronic device 1601. According to an embodiment, the battery 1689 may include, for example, a primary cell which is not rechargeable, a secondary cell which is rechargeable, or a fuel cell.

The communication module 1690 may support establishing a direct (e.g., wired) communication channel or a wireless communication channel between the electronic device 1601 and the external electronic device (e.g., the electronic device 1602, the electronic device 1604, or the server 1608) and performing communication via the established communication channel. The communication module 1690 may include one or more communication processors that are operable independently from the processor 1620 (e.g., the application processor (AP)) and supports a direct (e.g., wired) communication or a wireless communication. According to an embodiment, the communication module 1690 may include a wireless communication module 1692 (e.g., a cellular communication module, a short-range wireless communication module, or a global navigation satellite system (GNSS) communication module) or a wired communication module 1694 (e.g., a local area network (LAN) communication module or a power line communication (PLC) module). A corresponding one of these communication modules may communicate with the external electronic device via the first network 1698 (e.g., a short-range communication network, such as Bluetoot™, wireless-fidelity (Wi-Fi) direct, or infrared data association (IrDA)) or the second network 1699 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1692 may identify and authenticate the electronic device 1601 in a communication network, such as the first network 1698 or the second network 1699, using subscriber information (e.g., international mobile subscriber identity (IMSI)) stored in the subscriber identification module 1696.

The antenna module 1697 may transmit or receive a signal or power to or from the outside (e.g., the external electronic device) of the electronic device 1601. According to an embodiment, the antenna module 1697 may include an antenna including a radiating element composed of a conductive material or a conductive pattern formed in or on a substrate (e.g., PCB). According to an embodiment, the antenna module 1697 may include a plurality of antennas. In such a case, at least one antenna appropriate for a communication scheme used in the communication network, such as the first network 1698 or the second network 1699, may be selected, for example, by the communication module 1690 (e.g., the wireless communication module 1692) from the plurality of antennas. The signal or the power may then be transmitted or received between the communication module 1690 and the external electronic device via the selected at least one antenna. According to an embodiment, another component (e.g., a radio frequency integrated circuit (RFIC)) other than the radiating element may be additionally formed as part of the antenna module 1697.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1601 and the external electronic device 1604 via the server 1608 coupled with the second network 1699. Each of the electronic devices 1602 and 1604 may be a device of a same type as, or a different type, from the electronic device 1601. According to an embodiment, all or some of operations to be executed at the electronic device 1601 may be executed at one or more of the external electronic devices 1602, 1604, or 1608. For example, if the electronic device 1601 should perform a function or a service automatically, or in response to a request from a user or another device, the electronic device 1601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1601. The electronic device 1601 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1640) including one or more instructions that are stored in a storage medium (e.g., internal memory 1636 or external memory 1638) that is readable by a machine (e.g., the electronic device 1601). For example, a processor (e.g., the processor 1620) of the machine (e.g., the electronic device 1601) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 17:
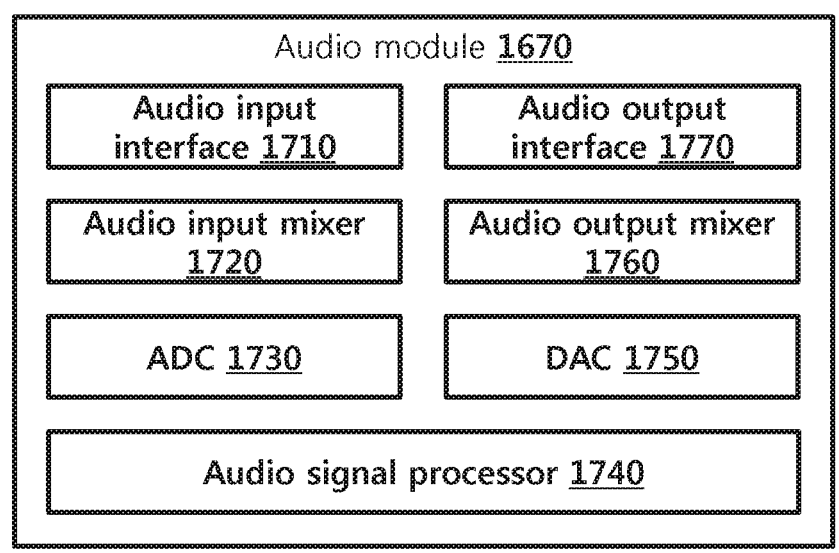
FIG. 17 is a block diagram of an audio module, according to one embodiment.

FIG. 17 is a block diagram of the audio module 1670, according to one embodiment.

Referring to FIG. 7, the audio module 1670 may include, for example, an audio input interface 1710, an audio input mixer 1720, an analog-to-digital converter (ADC) 1730, an audio signal processor 1740, a digital-to-analog converter (DAC) 7150, an audio output mixer 1760, or an audio output interface 1770.

The audio input interface 1710 may receive an audio signal corresponding to a sound obtained from the outside of the electronic device 1601 via a microphone (e.g., a dynamic microphone, a condenser microphone, or a piezo microphone) that is configured as part of the input device 1650 or separately from the electronic device 1601. For example, if an audio signal is obtained from the external electronic device 1602 (e.g., a headset or a microphone), the audio input interface 1710 may be connected with the external electronic device 1602 directly via the connecting terminal 1678, or wirelessly (e.g., Bluetooth™ communication) via the wireless communication module 1692 to receive the audio signal. According to one embodiment, the audio input interface 1710 may receive a control signal (e.g., a volume adjustment signal received via an input button) related to the audio signal obtained from the external electronic device 1602. The audio input interface 1710 may include a plurality of audio input channels and may receive a different audio signal via a corresponding one of the plurality of audio input channels, respectively. According to one embodiment, additionally or alternatively, the audio input interface 1710 may receive an audio signal from another component (e.g., the processor 1620 or the memory 1630) of the electronic device 1601.

The audio input mixer 1720 may synthesize a plurality of inputted audio signals into at least one audio signal. For example, according to one embodiment, the audio input mixer 1720 may synthesize a plurality of analog audio signals inputted via the audio input interface 1710 into at least one analog audio signal.

The ADC 1730 may convert an analog audio signal into a digital audio signal. For example, according to one embodiment, the ADC 1730 may convert an analog audio signal received via the audio input interface 1710 or, additionally or alternatively, an analog audio signal synthesized via the audio input mixer 1720 into a digital audio signal.

The audio signal processor 1740 may perform various processing on a digital audio signal received via the ADC 1730 or a digital audio signal received from another component of the electronic device 1601. For example, according to one embodiment, the audio signal processor 1740 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to one embodiment, one or more functions of the audio signal processor 1740 may be implemented in the form of an equalizer.

The DAC 1750 may convert a digital audio signal into an analog audio signal. For example, according to one embodiment, the DAC 1750 may convert a digital audio signal processed by the audio signal processor 1740 or a digital audio signal obtained from another component (e.g., the processor 1620 or the memory 1630) of the electronic device 1601 into an analog audio signal.

The audio output mixer 1760 may synthesize a plurality of audio signals, which are to be outputted, into at least one audio signal. For example, according to one embodiment, the audio output mixer 1760 may synthesize an analog audio signal converted by the DAC 1750 and another analog audio signal (e.g., an analog audio signal received via the audio input interface 1710) into at least one analog audio signal.

The audio output interface 1770 may output an analog audio signal converted by the DAC 1750 or, additionally or alternatively, an analog audio signal synthesized by the audio output mixer 1760 to the outside of the electronic device 1601 via the sound output device 1655. The sound output device 1655 may include, for example, a speaker, such as a dynamic driver or a balanced armature driver, or a receiver. According to one embodiment, the sound output device 1655 may include a plurality of speakers. In such a case, the audio output interface 1770 may output audio signals having a plurality of different channels (e.g., stereo channels or 5.1 channels) via at least some of the plurality of speakers. According to one embodiment, the audio output interface 1770 may be connected with the external electronic device 1602 (e.g., an external speaker or a headset) directly via the connecting terminal 1678 or wirelessly via the wireless communication module 1692 to output an audio signal.

According to one embodiment, the audio module 1670 may generate, without separately including the audio input mixer 1720 or the audio output mixer 1760, at least one digital audio signal by synthesizing a plurality of digital audio signals using at least one function of the audio signal processor 1740.

According to one embodiment, the audio module 1670 may include an audio amplifier (e.g., a speaker amplifying circuit) that is capable of amplifying an analog audio signal inputted via the audio input interface 1710 or an audio signal that is to be outputted via the audio output interface 1770. According to one embodiment, the audio amplifier may be configured as a module separate from the audio module 1670.

Figure 18:
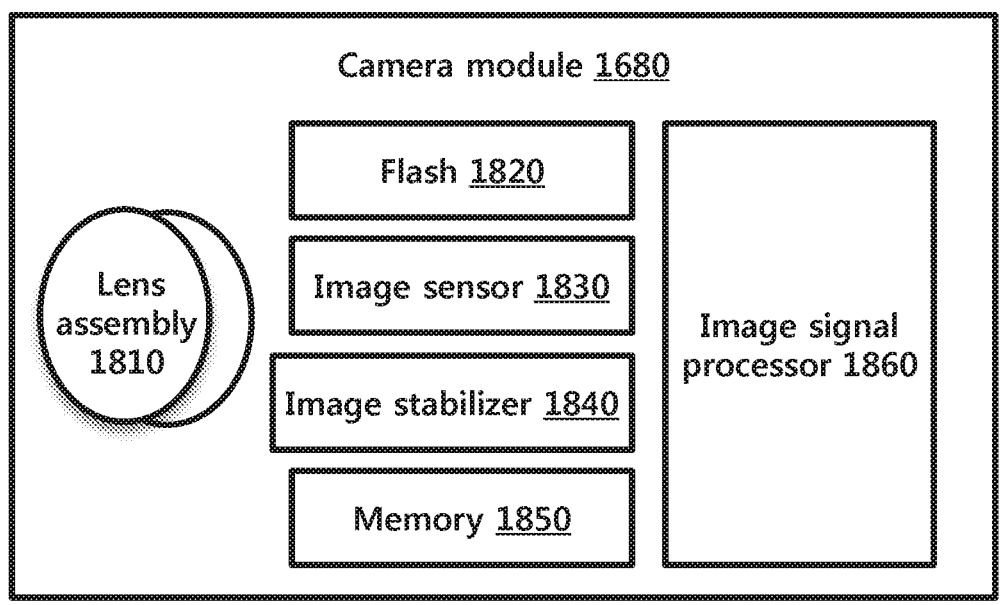
FIG. 18 is a block diagram of a camera module, according to one embodiment.

FIG. 18 is a block diagram of the camera module 1680, according to one embodiment.

Referring to FIG. 18, the camera module 1680 may include a lens assembly 1810, a flash 1820, an image sensor 1830, an image stabilizer 1840, a memory 1850 (e.g., a buffer memory), or an image signal processor 1860. The lens assembly 1810 may collect light emitted or reflected from an object whose image is to be taken. The lens assembly 1810 may include one or more lenses. According to one embodiment, the camera module 1680 may include a plurality of lens assemblies 1810. In this case, the camera module 1680 may form, for example, a dual camera, a 360-degree camera, or a spherical camera. Some of the plurality of lens assemblies 1810 may have the same lens attribute (e.g., view angle, focal length, auto-focusing, f number, or optical zoom), or at least one lens assembly may have one or more lens attributes that are different from those of another lens assembly. The lens assembly 1810 may include, for example, a wide-angle lens or a telephoto lens.

The flash 1820 may emit light that is used to reinforce light reflected from an object. According to one embodiment, the flash 1820 may include one or more light emitting diodes (LEDs) (e.g., a red-green-blue (RGB) LED, a white LED, an infrared (IR) LED, or an ultraviolet (UV) LED) or a xenon lamp. The image sensor 1830 may obtain an image corresponding to an object by converting light emitted or reflected from the object and transmitted via the lens assembly 1810 into an electrical signal. According to one embodiment, the image sensor 1830 may be selected from image sensors having different attributes, such as an RGB sensor, a black-and-white (BW) sensor, an IR sensor, or a UV sensor, a plurality of image sensors having the same attribute, or a plurality of image sensors having different attributes. Each image sensor included in the image sensor 1830 may be implemented using, for example, a charged coupled device (CCD) sensor or a complementary metal oxide semiconductor (CMOS) sensor.

The image stabilizer 1840 may move the image sensor 1830 or at least one lens included in the lens assembly 1810 in a particular direction, or control an operational attribute (e.g., adjust the read-out timing) of the image sensor 1830 in response to the movement of the camera module 1680 or the electronic device 1601 including the camera module 1680. This allows compensating for at least part of a negative effect (e.g., image blurring) by the movement on an image being captured. According to one embodiment, the image stabilizer 1840 may sense such a movement by the camera module 1680 or the electronic device 1601 using a gyro sensor or an acceleration sensor disposed inside or outside the camera module 1680. According to one embodiment, the image stabilizer 1840 may be implemented, for example, as an optical image stabilizer.

The memory 1850 may store, at least temporarily, at least part of an image obtained via the image sensor 1830 for a subsequent image processing task. For example, if image capturing is delayed due to shutter lag or multiple images are quickly captured, a raw image obtained (e.g., a Bayer-patterned image, a high-resolution image) may be stored in the memory 1850, and its corresponding copy image (e.g., a low-resolution image) may be previewed via the display device 1660. Thereafter, if a specified condition is met (e.g., by a user's input or system command), at least part of the raw image stored in the memory 1850 may be obtained and processed, for example, by the image signal processor 1860. According to one embodiment, the memory 1850 may be configured as at least part of the memory 1630 or as a separate memory that is operated independently from the memory 1630.

The image signal processor 1860 may perform one or more image processing with respect to an image obtained via the image sensor 1830 or an image stored in the memory 1850. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 1860 may perform control (e.g., exposure time control or read-out timing control) with respect to at least one (e.g., the image sensor 1830) of the components included in the camera module 1680. An image processed by the image signal processor 1860 may be stored in the memory 1850 for further processing, or may be provided to an external component (e.g., the memory 1630, the display device 1660, the electronic device 1602, the electronic device 1604, or the server 1608) outside the camera module 1680. According to one embodiment, the image signal processor 1860 may be configured as at least part of the processor 1620, or as a separate processor that is operated independently from the processor 1620. If the image signal processor 1860 is configured as a separate processor from the processor 1620, at least one image processed by the image signal processor 1860 may be displayed, by the processor 1620, via the display device 1660 as it is or after being further processed.

According to one embodiment, the electronic device 1601 may include a plurality of camera modules 1680 having different attributes or functions. In this case, at least one of the plurality of camera modules 1680 may form, for example, a wide-angle camera and at least another of the plurality of camera modules 1680 may form a telephoto camera. Similarly, at least one of the plurality of camera modules 1680 may form, for example, a front camera and at least another of the plurality of camera modules 1680 may form a rear camera.

Figure 19:
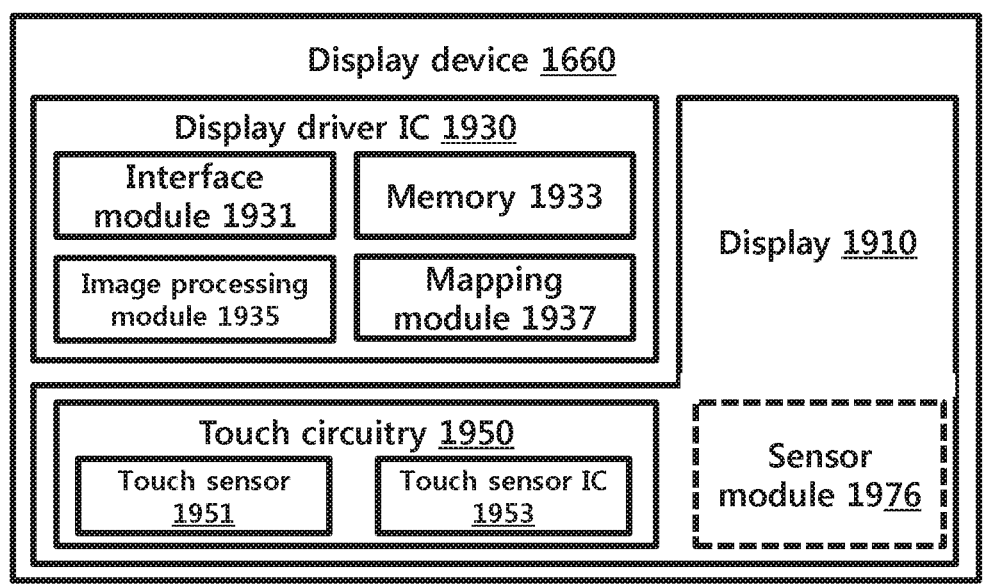
FIG. 19 is a block diagram of a display device, according to one embodiment.

FIG. 19 is a block diagram of the display device 1660, according to one embodiment.

Referring to FIG. 19, the display device 1660 may include a display 1910 and a display driver integrated circuit (DDI) 1930 to control the display 1910. The DDI 1930 may include an interface module 1931, a memory 1933 (e.g., a buffer memory), an image processing module 1935, or a mapping module 1937. The DDI 1930 may receive image information that contains image data or an image control signal corresponding to a command to control the image data from another component of the electronic device 1601 via the interface module 1931. For example, according to one embodiment, the image information may be received from the processor 1620 (e.g., the main processor 1621 (e.g., an AP)) or the auxiliary processor 1623 (e.g., a graphics processing unit) operated independently from the function of the main processor 1621. The DDI 1930 may communicate, for example, with touch circuitry 1950 or the sensor module 1976 via the interface module 1931. The DDI 1930 may also store at least part of the received image information in the memory 1933, for example, on a frame by frame basis.

The image processing module 1935 may perform pre-processing or post-processing (e.g., adjustment of resolution, brightness, or size) with respect to at least part of the image data. According to one embodiment, the pre-processing or post-processing may be performed, for example, based at least in part on one or more characteristics of the image data or one or more characteristics of the display 1910.

The mapping module 1937 may generate a voltage value or a current value corresponding to the image data pre-processed or post-processed by the image processing module 1935. According to one embodiment, generation of the voltage value or current value may be performed, for example, based at least in part on one or more attributes of the pixels (e.g., an array, such as an RGB stripe or a pentile structure, of the pixels, or the size of each subpixel). At least some pixels of the display 1910 may be driven, for example, based at least in part on the voltage value or the current value such that visual information (e.g., a text, an image, or an icon) corresponding to the image data may be displayed via the display 1910.

According to one embodiment, the display device 1660 may further include the touch circuitry 1950. The touch circuitry 1950 may include a touch sensor 1951 and a touch sensor IC 1953 to control the touch sensor 1951. The touch sensor IC 953 may control the touch sensor 1951 to sense a touch input or a hovering input with respect to a certain position on the display 1910. To achieve this, for example, the touch sensor 1951 may detect (e.g., measure) a change in a signal (e.g., a voltage, a quantity of light, a resistance, or a quantity of one or more electrical charges) corresponding to the certain position on the display 1910. The touch circuitry 1950 may provide input information (e.g., a position, an area, a pressure, or a time) indicative of the touch input or the hovering input detected via the touch sensor 1951 to the processor 1620. At least part (e.g., the touch sensor IC 1953) of the touch circuitry 1950 may be formed as part of the display 1910 or the DDI 1930, or as part of another component (e.g., the auxiliary processor 623) disposed outside the display device 1660.

According to one embodiment, the display device 1660 may further include at least one sensor (e.g., a fingerprint sensor, an iris sensor, a pressure sensor, or an illuminance sensor) of the sensor module 1676 or a control circuit for the at least one sensor. In this case, the at least one sensor or the control circuit for the at least one sensor may be embedded in one portion of a component (e.g., the display 1910, the DDI 1930, or the touch circuitry 1950) of the display device 1660. For example, when the sensor module 1676 embedded in the display device 1660 includes a biometric sensor (e.g., a fingerprint sensor), the biometric sensor may obtain biometric information (e.g., a fingerprint image) corresponding to a touch input received via a portion of the display 1910. For example, when the sensor module 1976 embedded in the display device 1660 includes a pressure sensor, the pressure sensor may obtain pressure information corresponding to a touch input received via a partial or whole area of the display 1910. The touch sensor 1951 or the sensor module 1976 may be disposed between pixels in a pixel layer of the display 1910, or over or under the pixel layer.

Figure 20:
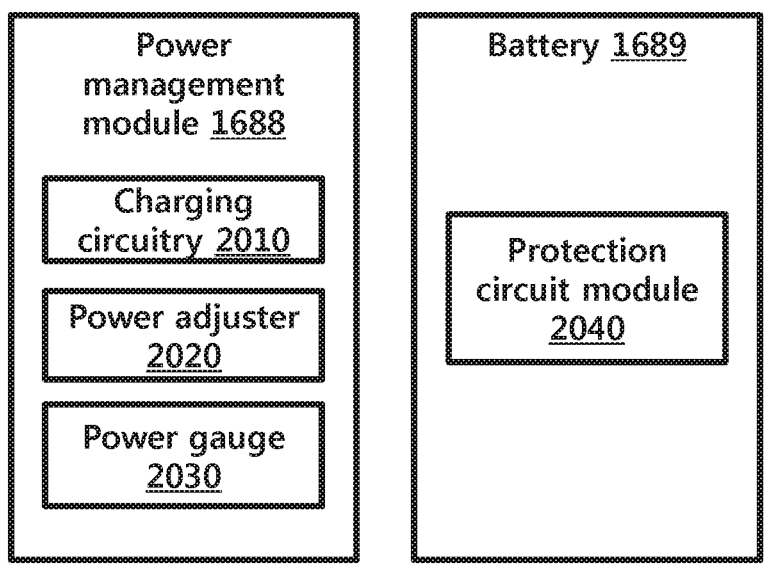
FIG. 20 is a block diagram of a power management module and a battery, according to one embodiment.

FIG. 20 is a block diagram of the power management module 1688 and the battery 1689, according to one embodiment.

Referring to FIG. 20, the power management module 1688 may include charging circuitry 2010, a power adjuster 2020, or a power gauge 2030. The charging circuitry 2010 may charge the battery 1689 by using power supplied from an external power source outside the electronic device 1601. According to one embodiment, the charging circuitry 2010 may select a charging scheme (e.g., normal charging or quick charging) based at least in part on a type of the external power source (e.g., a power outlet, a USB, or wireless charging), magnitude of power capable of being supplied from the external power source (e.g., about 20 Watt or more), or an attribute of the battery 1689, and may charge the battery 1689 using the selected charging scheme. The external power source may be connected with the electronic device 1601, for example, directly via the connecting terminal 1678 or wirelessly via the antenna module 1697.

The power adjuster 2020 may generate a plurality of powers having different voltage levels or different current levels by adjusting a voltage level or a current level of the power supplied from the external power source or the battery 1689. The power adjuster 2020 may adjust the voltage level or the current level of the power supplied from the external power source or the battery 1689 into a different voltage level or current level appropriate for each of some of the components included in the electronic device 1601. According to one embodiment, the power adjuster 2020 may be implemented in the form of a low drop out (LDO) regulator or a switching regulator. The power gauge 2030 may measure use state information about the battery 1689 (e.g., a capacity, a number of times of charging or discharging, a voltage, or a temperature of the battery 1689).

The power management module 1688 may determine, using, for example, the charging circuitry 2010, the power adjuster 2020, or the power gauge 2030, charging state information (e.g., lifetime, over voltage, low voltage, over current, over charge, over discharge, overheating, a short, or swelling) related to the charging of the battery 1689 based at least in part on the measured use state information about the battery 1689. The power management module 1688 may determine whether the state of the battery 1689 is normal or abnormal based at least in part on the determined charging state information. If the state of the battery 1689 is determined to be abnormal, the power management module 1688 may adjust the charging of the battery 1689 (e.g., reduce the charging current or voltage, or stop the charging). According to one embodiment, at least some of the functions of the power management module 1688 may be performed by an external control device (e.g., the processor 1620).

The battery 1689, according to one embodiment, may include a protection circuit module (PCM) 2040. The PCM 2040 may perform one or more of various functions (e.g., a pre-cutoff function) to prevent performance degradation of, or damage to, the battery 1689. The PCM 2040, additionally or alternatively, may be configured as at least part of a battery management system (BMS) capable of performing various functions including cell balancing, measurement of battery capacity, count of a number of charging or discharging, measurement of temperature, or measurement of voltage.

According to one embodiment, at least part of the charging state information or use state information regarding the battery 1689 may be measured using a corresponding sensor (e.g., a temperature sensor) of the sensor module 1676, the power gauge 2030, or the power management module 1688. The corresponding sensor (e.g., a temperature sensor) of the sensor module 1676 may be included as part of the PCM 2040, or may be disposed near the battery 1689 as a separate device.

Figure 21:
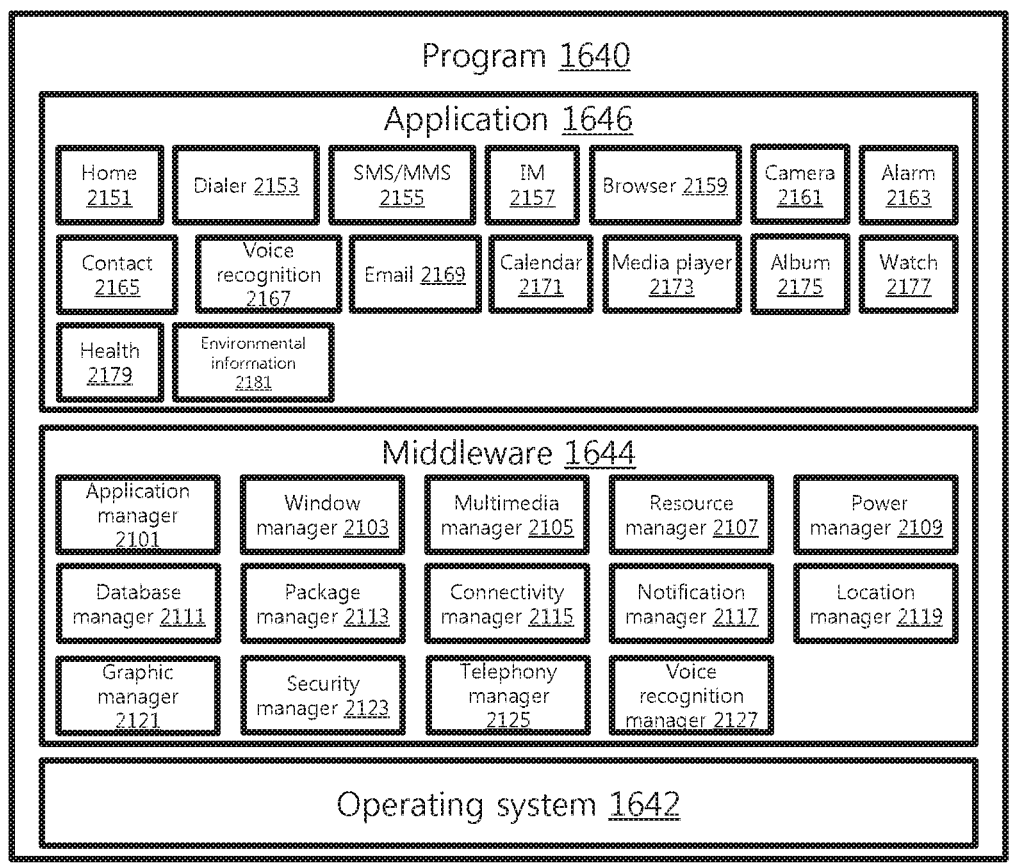
FIG. 21 is a block diagram of a program, according to one embodiment.

FIG. 21 is a block diagram of the program 1640 according to one embodiment.

Referring to FIG. 21, the program 1640 may include an OS 1642 to control one or more resources of the electronic device 1601, middleware 1644, or an application 1646 executable in the OS 1642. The OS 1642 may include, for example, Android®, iOS®, Windows®, Symbian®, Tizen®, or Bada™. At least part of the program 1640, for example, may be pre-loaded on the electronic device 1601 during manufacture, or may be downloaded from or updated by an external electronic device (e.g., the electronic device 1602 or 1604, or the server 1608) during use by a user.

The OS 1642 may control management (e.g., allocating or deallocation) of one or more system resources (e.g., process, memory, or power source) of the electronic device 1601. The OS 1642, additionally or alternatively, may include one or more driver programs to drive other hardware devices of the electronic device 1601, for example, the input device 1650, the sound output device 1655, the display device 1660, the audio module 1670, the sensor module 1676, the interface 1677, the haptic module 1679, the camera module 1680, the power management module 1688, the battery 1689, the communication module 1690, the subscriber identification module 1696, or the antenna module 1697.

The middleware 1644 may provide various functions to the application 1646 such that a function or information provided from one or more resources of the electronic device 1601 may be used by the application 1646. The middleware 1644 may include, for example, an application manager 2101, a window manager 2103, a multimedia manager 2105, a resource manager 2107, a power manager 2109, a database manager 2111, a package manager 2113, a connectivity manager 2115, a notification manager 2117, a location manager 2119, a graphic manager 2121, a security manager 2123, a telephony manager 2125, or a voice recognition manager 2127.

The application manager 2101, for example, may manage the life cycle of the application 1646. The window manager 2103, for example, may manage one or more graphical user interface (GUI) resources that are used on a screen. The multimedia manager 2105, for example, may identify one or more formats to be used to play media files, and may encode or decode a corresponding one of the media files using a codec appropriate for a corresponding format selected from the one or more formats. The resource manager 2107, for example, may manage the source code of the application 1646 or a memory space of the memory 1630. The power manager 2109, for example, may manage the capacity, temperature, or power of the battery 1689, and determine or provide related information to be used for the operation of the electronic device 1601 based at least in part on corresponding information of the capacity, temperature, or power of the battery 1689. According to one embodiment, the power manager 2109 may interoperate with a basic input/output system (BIOS) of the electronic device 1601.

The database manager 2111, for example, may generate, search, or change a database to be used by the application 1646. The package manager 2113, for example, may manage installation or update of an application that is distributed in the form of a package file. The connectivity manager 2115, for example, may manage a wireless connection or a direct connection between the electronic device 1601 and the external electronic device. The notification manager 2117, for example, may provide a function to notify a user of an occurrence of a specified event (e.g., an incoming call, message, or alert). The location manager 2119, for example, may manage locational information on the electronic device 1601. The graphic manager 2121, for example, may manage one or more graphic effects to be offered to a user or a user interface related to the one or more graphic effects.

The security manager 2123, for example, may provide system security or user authentication. The telephony manager 2125, for example, may manage a voice call function or a video call function provided by the electronic device 1601. The voice recognition manager 2127, for example, may transmit a user's voice data to the server 1608, and receive, from the server 1608, a command corresponding to a function to be executed on the electronic device 1601 based at least in part on the voice data, or text data converted based at least in part on the voice data. According to one embodiment, the middleware 1644 may dynamically delete some existing components or add new components. According to one embodiment, at least part of the middleware 1644 may be included as part of the OS 1642 or may be implemented in other software separate from the OS 1642.

The application 1646 may include, for example, a home application 2151, a dialer application 2153, a short message service (SMS)/multimedia messaging service (MMS) application 2155, an instant message (IM) application 2157, a browser application 2159, a camera application 2161, an alarm application 2163, a contact application 2165, a voice recognition application 2167, an email application 2169, a calendar application 2171, a media player application 2173, an album application 2175, a watch application 2177, a health application 2179 (e.g., for measuring the degree of workout or biometric information, such as blood sugar), or an environmental information application 2181 (e.g., for measuring air pressure, humidity, or temperature information). According to one embodiment, the application 1646 may further include an information exchanging application that is capable of supporting information exchange between the electronic device 1601 and the external electronic device. The information exchange application, for example, may include a notification relay application adapted to transfer designated information (e.g., a call, a message, or an alert) to the external electronic device or a device management application adapted to manage the external electronic device. The notification relay application may transfer notification information corresponding to an occurrence of a specified event (e.g., receipt of an email) at another application (e.g., the email application 2169) of the electronic device 1601 to the external electronic device. Additionally or alternatively, the notification relay application may receive notification information from the external electronic device and provide the notification information to a user of the electronic device 1601.

The device management application may control the power (e.g., turn-on or turn-off) or the function (e.g., adjustment of brightness, resolution, or focus) of the external electronic device or some component thereof (e.g., a display device or a camera module of the external electronic device). The device management application, additionally or alternatively, may support installation, delete, or update of an application running on the external electronic device.

Figure 22:
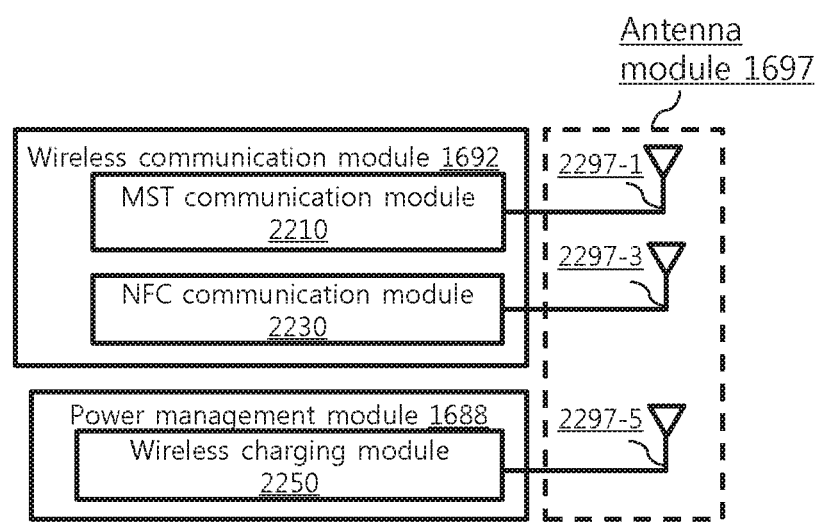
FIG. 22 is a block diagram of a wireless communication module, a power management module, and an antenna module of an electronic device, according to one embodiment, according to one embodiment.

FIG. 22 is a block diagram of the wireless communication module 1692, the power management module 1688, and the antenna module 1697 of the electronic device 1601, according to one embodiment.

Referring to FIG. 22, the wireless communication module 1692 may include a magnetic secure transmission (MST) communication module 2210 or a near-field communication (NFC) module 2230, and the power management module 1688 may include a wireless charging module 2250. In this case, the antenna module 1697 may include a plurality of antennas that include an MST antenna 2297-1 connected with the MST communication module 2210, an NFC antenna 2297-3 connected with the NFC communication module 2230, and a wireless charging antenna 2297-5 connected with the wireless charging module 2250. Descriptions of components described above with regard to FIG. 16 are either briefly described or omitted here.

The MST communication module 2210 may receive a signal containing control information or payment information such as card (e.g., credit card) information from the processor 1620, generate a magnetic signal corresponding to the received signal, and then transfer the generated magnetic signal to the external electronic device 1602 (e.g., a point-of-sale (POS) device) via the MST antenna 2297-1. To generate the magnetic signal, according to one embodiment, the MST communication module 2210 may include a switching module that includes one or more switches connected with the MST antenna 2297-1, and control the switching module to change the direction of voltage or current supplied to the MST antenna 2297-1 according to the received signal. The change of the direction of the voltage or current allows the direction of the magnetic signal (e.g., a magnetic field) emitted from the MST antenna 2297-1 to change accordingly. If detected at the external electronic device 1602, the magnetic signal with its direction changing may cause an effect (e.g., a waveform) similar to that of a magnetic field that is generated when a magnetic card corresponding to the card information associated with the received signal is swiped through a card reader of the electronic device 1602. According to one embodiment, for example, payment-related information and a control signal that are received by the electronic device 1602 in the form of the magnetic signal may be further transmitted to an external server 1608 (e.g., a payment server) via the network 1699.

The NFC communication module 2230 may obtain a signal containing control information or payment information such as card information from the processor 1620 and transmit the obtained signal to the external electronic device 1602 via the NFC antenna 2297-3. According to one embodiment, the NFC communication module 2230 may receive such a signal transmitted from the external electronic device 1602 via the NFC antenna 2297-3.

The wireless charging module 2250 may wirelessly transmit power to the external electronic device 1602 (e.g., a cellular phone or wearable device) via the wireless charging antenna 2297-5, or wirelessly receive power from the external electronic device 1602 (e.g., a wireless charging device). The wireless charging module 2250 may support one or more of various wireless charging schemes including, for example, a magnetic resonance scheme or a magnetic induction scheme.

According to one embodiment, some of the MST antenna 2297-1, the NFC antenna 2297-3, or the wireless charging antenna 2297-5 may share at least part of their radiators. For example, the radiator of the MST antenna 2297-1 may be used as the radiator of the NFC antenna 2297-3 or the wireless charging antenna 2297-5, or vice versa. In this case, the antenna module 1697 may include a switching circuit adapted to selectively connect (e.g., close) or disconnect (e.g., open) at least part of the antennas 2297-1, 2297-3, and 2297-5, for example, under control of the wireless communication module 1692 (e.g., the MST communication module 2210 or the NFC communication module 2230) or the power management module (e.g., the wireless charging module 2250). For example, when the electronic device 1601 uses a wireless charging function, the NFC communication module 2230 or the wireless charging module 2250 may control the switching circuit to temporarily disconnect at least one portion of the radiators shared by the NFC antenna 2297-3 and the wireless charging antenna 2297-5 from the NFC antenna 2297-3 and to connect the at least one portion of the radiators with the wireless charging antenna 2297-5.

According to one embodiment, at least one function of the MST communication module 2210, the NFC communication module 2230, or the wireless charging module 2250 may be controlled by an external processor (e.g., the processor 1620). According to one embodiment, at least one specified function (e.g., a payment function) of the MST communication module 2210 or the NFC communication module 2230 may be performed in a trusted execution environment (TEE). The TEE may form an execution environment in which, for example, at least some designated area of the memory 2230 is allocated to be used for performing a function (e.g., a financial transaction or personal information-related function) that requires a relatively high level of security. In this case, access to the at least some designated area of the memory 1630 may be restrictively permitted, for example, according to an entity accessing thereto or an application being executed in the TEE.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A synchronized in-phase/quadrature phase (I/Q) detection circuit, comprising:
   a first multiplexer configured to provide, to a first phase detector, a first subset of input signals and, subsequently, a second subset of input signals;
   the first phase detector configured to receive, from the first multiplexer, the first subset of input signals and, subsequently, the second subset of input signals;
   a first reset and sampling circuit configured to receive outputs of the first phase detector;
   a second multiplexer configured to provide a second set of input signals to a second phase detector;
   the second phase detector configured to receive the second set of input signals from the second multiplexer while the first multiplexer receives the first and second subsets of input signals, wherein the first subset of input signals has a same phase order as the second set of input signals, and the second subset of input signals has a different phase order than the second set of input signals;
   a second reset and sampling circuit configured to receive outputs of the second phase detector; and
   a comparator configured to output a detected phase difference based on the outputs of the first and second reset and sampling circuits.

2. The synchronized I/Q detection circuit of claim 1, wherein the comparator is further configured to:
   receive at least two sets of differential inputs, wherein at least one of the at least two sets of differential inputs are outputs of the first reset and sampling circuit and the second reset and sampling circuit; and
   cancel settling of an output of the first reset and sampling circuit with settling of an output of the second reset and sampling circuit.

3. The synchronized IQ detection circuit of claim 1, wherein the output of the comparator is a direct current (DC) voltage.

4. The synchronized IQ detection circuit of claim 1, further comprising:
   a control signal generator configured to output reset and sampling signals to control the first reset and sampling circuit and the second reset and sampling circuit.

5. The synchronized I/Q detection circuit of claim 1, wherein:
   the first phase detector includes a first two-input NAND gate and a second two-input NAND gate connected to the first multiplexer, and a third two-input NAND gate connected to the first two-input NAND gate and the second two-input NAND gate; and
   the second phase detector includes a fourth two-input NAND gate and a fifth two-input NAND gate connected to the second multiplexer, and a sixth two-input NAND gate connected to the fourth two-input NAND gate and the fifth NAND gate.

6. The synchronized I/Q detection circuit of claim 1, wherein:
   the first reset and sampling circuit includes a first filter including a first resistor and a first capacitor; and
   the second reset and sampling circuit includes a second filter including a second resistor and a second capacitor.

7. The synchronized I/Q detection circuit of claim 1, wherein:
the first phase detector includes a two-input AND gate; and
the second phase detector includes a two-input AND gate.

8. The synchronized I/Q detection circuit of claim 1, wherein:
the first phase detector includes a first two-input NAND gate, a first inverter, a second two-input NAND gate, a second inverter, and a third two-input NAND gate; and
the second phase detector includes a fourth two-input NAND gate, a fifth two-input NAND gate, a fourth inverter, and a sixth two-input NAND gate.

9. The synchronized I/Q detection circuit of claim 1, wherein:
the first phase detector includes a two-input AND gate, and a first inverter; and
the second phase detector includes a two-input AND gate, and a second inverter.

10. The synchronized I/Q detection circuit of claim 1, wherein:
the first phase detector includes a two-input XOR gate; and
the second phase detector includes a two-input XNOR gate.

11. The synchronized I/Q detection circuit of claim 4, wherein the control signal generator includes a first flip-flop, a second flip-flop, a third flip-flop, a fourth flip-flop, a fifth flip-flop, a sixth flip-flop, a first two-input NOR gate; and a second two-input NOR gate.

12. The synchronized I/Q detection circuit of claim 6, wherein:
the first reset and sampling circuit further includes a first switch, a second switch, a third switch, and a third capacitor; and
the second reset and sampling circuit further includes a fourth switch, a fifth switch, a sixth switch, and a fourth capacitor.

13. A method of performing a synchronized in-phase/quadrature phase (I/Q) detection circuit, the method comprising:
providing, by a first multiplexer, a first subset of input signals and, subsequently, a second subset of input signals to a first phase detector;
receiving, by the first phase detector, from the first multiplexer, the first subset of input signals and, subsequently, the second subset of input signals;
receiving, by a first reset and sampling circuit, outputs of the first phase detector;
providing, by a second multiplexer, a second set of input signals to a second phase detector;
receiving, by the second phase detector, from the second multiplexer, the second set of input signals while the first multiplexer receives the first and second subsets of input signals, wherein the first subset of input signals has a same phase order as the second set of input signals, and the second subset of input signals has a different phase order than the second set of input signals;
receiving, by a second reset and sampling circuit, outputs of the second phase detector; and
outputting, by a comparator, a detected phase difference based on the outputs of the first and second reset and sampling circuits.

14. The method of claim 13, further comprising:
receiving, by the comparator, at least two sets of differential inputs, wherein at least one of the at least two sets of differential inputs are outputs of the first reset and sampling circuit and the second reset and sampling circuit; and
cancelling, by the comparator, settling of an output of the first reset and sampling circuit with settling of an output of the second reset and sampling circuit.

15. The method of claim 13, wherein the output of the comparator is a direct current (DC) voltage.

16. The method of claim 13, further comprising:
outputting, by a control signal generator, reset and sampling signals to control the first reset and sampling circuit and the second reset and sampling circuit.

17. The method of claim 13, wherein:
the first phase detector includes a first two-input NAND gate and a second two-input NAND gate connected to the first multiplexer, and a third two-input NAND gate connected to the first two-input NAND gate and the second two-input NAND gate; and
the second phase detector includes a fourth two-input NAND gate and a fifth two-input NAND gate connected to the second multiplexer, and a sixth two-input NAND gate connected to the fourth two-input NAND gate and the fifth NAND gate.

18. The method of claim 13, wherein:
the first reset and sampling circuit includes a first filter including a first resistor and a first capacitor; and
the second reset and sampling circuit includes a second filter including a second resistor and a second capacitor.

19. The method of claim 13, wherein:
the first phase detector includes a two-input AND gate; and
the second phase detector includes a two-input AND gate.

20. The method of claim 13, wherein:
the first phase detector includes a first two-input NAND gate, a first inverter, a second two-input NAND gate, a second inverter, and a third two-input NAND gate; and
the second phase detector includes a fourth two-input NAND gate, a fifth two-input NAND gate, a fourth inverter, and a sixth two-input NAND gate.

21. The method of claim 13, wherein:
the first phase detector includes a two-input AND gate, and a first inverter; and
the second phase detector includes a two-input AND gate, and a second inverter.

22. The method of claim 13, wherein:
the first phase detector includes a two-input XOR gate; and
the second phase detector includes a two-input XNOR gate.

23. The method of claim 16, wherein the control signal generator includes a first flip-flop, a second flip-flop, a third flip-flop, a fourth flip-flop, a fifth flip-flop, a sixth flip-flop, a first two-input NOR gate; and a second two-input NOR gate.

24. The method of claim 18, wherein:
the first reset and sampling circuit further includes a first switch, a second switch, a third switch, and a third capacitor; and
the second reset and sampling circuit further includes a fourth switch, a fifth switch, a sixth switch, and a fourth capacitor.

* * * * *